United States Patent
Konevecki et al.

(10) Patent No.: US 9,450,023 B1
(45) Date of Patent: Sep. 20, 2016

(54) VERTICAL BIT LINE NON-VOLATILE MEMORY WITH RECESSED WORD LINES

(71) Applicant: SanDisk 3D LLC, Milpitas, CA (US)

(72) Inventors: Michael Konevecki, San Jose, CA (US); Vance Dunton, San Jose, CA (US); Steve Radigan, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/681,398

(22) Filed: Apr. 8, 2015

(51) Int. Cl.
| | |
|---|---|
| *H01L 29/47* | (2006.01) |
| *H01L 29/80* | (2006.01) |
| *H01L 29/94* | (2006.01) |
| *H01L 21/00* | (2006.01) |
| *H01L 21/8238* | (2006.01) |
| *H01L 27/24* | (2006.01) |
| *H01L 45/00* | (2006.01) |

(52) U.S. Cl.
CPC ......... *H01L 27/2454* (2013.01); *H01L 27/249* (2013.01); *H01L 45/08* (2013.01); *H01L 45/124* (2013.01); *H01L 45/1253* (2013.01); *H01L 45/16* (2013.01)

(58) Field of Classification Search
CPC .................... H01L 27/7926; H01L 27/11556; H01L 29/7889; H01L 27/11578; H01L 29/66666; H01L 29/78642
USPC ........ 257/135, 220, 263, 302, 328; 438/156, 438/173, 192, 212, 268
See application file for complete search history.

(56) References Cited

U.S. PATENT DOCUMENTS

| | | |
|---|---|---|
| 4,370,661 A | 1/1983 | Berkowitz |
| 5,313,432 A | 5/1994 | Lin |
| 5,442,215 A | 8/1995 | Chae |
| 5,915,167 A | 6/1999 | Leedy |
| 5,936,896 A | 8/1999 | Cho |
| 6,049,106 A | 4/2000 | Forbes |

(Continued)

FOREIGN PATENT DOCUMENTS

| | | |
|---|---|---|
| WO | WO2008/118435 A1 | 10/2008 |
| WO | WO2010/117912 A1 | 10/2010 |

(Continued)

OTHER PUBLICATIONS

U.S. Appl. No. 14/197,985, filed Mar. 5, 2014.

(Continued)

*Primary Examiner* — Hsien Ming Lee
(74) *Attorney, Agent, or Firm* — Vierra Magen Marcus LLP

(57) ABSTRACT

A three-dimensional (3D) non-volatile memory array is provided having multiple word line layers stacked vertically with interleaving insulating layers over a vertically-oriented thin film transistor (TFT). The vertically-oriented TFT is used as a bit line selection device to couple a global bit line to a vertical bit line formed in a trench between portions of the word line and insulating layer stack. The word line layers are recessed horizontally to form recesses relative to the vertical bit line trench. The horizontal recesses provide spatial separation between memory cell areas and surfaces exposed during process steps. A memory material is formed conformally within the recesses, followed by a thin protective film. The film protects the memory material during etching to expose the vertical TFT for contact to the vertical bit line. Methods of fabricating arrays including recessed memory cell areas are provided.

27 Claims, 27 Drawing Sheets

(56) References Cited

U.S. PATENT DOCUMENTS

| | | | |
|---|---|---|---|
| 6,141,236 A | 10/2000 | Kengeri | |
| 6,222,762 B1 | 4/2001 | Guterman | |
| 6,310,793 B1 | 10/2001 | Brox | |
| 6,388,927 B1 | 5/2002 | Churchill | |
| 6,399,447 B1 | 6/2002 | Clevenger | |
| 6,459,123 B1 | 10/2002 | Enders | |
| 6,480,417 B2 | 11/2002 | Elmhurst | |
| 6,492,212 B1 | 12/2002 | Ieong | |
| 6,538,922 B1 | 3/2003 | Khalid et al. | |
| 6,542,431 B2 | 4/2003 | Nakagawa | |
| 6,569,715 B1 | 5/2003 | Forbes | |
| 6,610,576 B2 | 8/2003 | Nowak | |
| 6,617,180 B1 | 9/2003 | Wang | |
| 6,678,192 B2 | 1/2004 | Gongwer | |
| 6,750,487 B2 | 6/2004 | Fried | |
| 6,841,834 B2 | 1/2005 | Nowak | |
| 6,879,505 B2 | 4/2005 | Scheuerlein | |
| 6,930,324 B2 | 8/2005 | Kowalski | |
| 7,019,342 B2 | 3/2006 | Hackler, Sr. | |
| 7,101,741 B2 | 9/2006 | Fried | |
| 7,130,239 B2 | 10/2006 | Lakhani | |
| 7,132,685 B2 | 11/2006 | Chen | |
| 7,184,302 B2 | 2/2007 | Yang | |
| 7,233,024 B2 | 6/2007 | Scheuerlein | |
| 7,237,074 B2 | 6/2007 | Guterman | |
| 7,249,225 B1 | 7/2007 | Seidl | |
| 7,256,458 B2 | 8/2007 | Nowak | |
| 7,324,393 B2 | 1/2008 | Chan et al. | |
| 7,468,906 B2 | 12/2008 | Kuo | |
| 7,486,587 B2 | 2/2009 | Scheuerlein | |
| 7,489,002 B2 | 2/2009 | Forbes et al. | |
| 7,518,182 B2 | 4/2009 | Abbott et al. | |
| 7,558,141 B2 | 7/2009 | Katsumata et al. | |
| 7,588,971 B2 | 9/2009 | Wang et al. | |
| 7,613,868 B2 | 11/2009 | Yang | |
| 7,634,744 B2 | 12/2009 | Sumimoto | |
| 7,645,650 B2 | 1/2010 | Bryant | |
| 7,768,013 B2 | 8/2010 | Kim et al. | |
| 7,830,713 B2 | 11/2010 | Lee | |
| 7,869,258 B2 | 1/2011 | Scheuerlein | |
| 7,952,163 B2 | 5/2011 | Baek | |
| 7,983,065 B2 | 7/2011 | Samachisa | |
| 8,003,457 B2 | 8/2011 | Chen | |
| 8,027,209 B2 | 9/2011 | Yan | |
| 8,199,576 B2 | 6/2012 | Fasoli et al. | |
| 8,411,477 B2 | 4/2013 | Tang et al. | |
| 8,618,614 B2 | 12/2013 | Scheuerlein | |
| 8,625,322 B2 * | 1/2014 | Samachisa | G11C 13/0002 365/130 |
| 8,885,389 B2 | 11/2014 | Scheuerlein | |
| 8,923,048 B2 | 12/2014 | Rabkin et al. | |
| 8,947,944 B2 | 2/2015 | Balakrishnan et al. | |
| 9,099,202 B2 | 8/2015 | Mihnea et al. | |
| 2003/0003611 A1 | 1/2003 | Weiner | |
| 2003/0206481 A1 | 11/2003 | Hsu | |
| 2004/0151024 A1 | 8/2004 | Fricke | |
| 2004/0159868 A1 | 8/2004 | Rinerson | |
| 2004/0178446 A1 | 9/2004 | Sundaresan | |
| 2005/0022264 A1 | 1/2005 | Fanger | |
| 2006/0145144 A1 | 7/2006 | Lee et al. | |
| 2006/0197153 A1 | 9/2006 | Huang et al. | |
| 2006/0250837 A1 | 11/2006 | Herner | |
| 2006/0273370 A1 | 12/2006 | Forbes | |
| 2007/0083679 A1 | 4/2007 | Kikuchi | |
| 2007/0133268 A1 | 6/2007 | Choi | |
| 2008/0002461 A1 | 1/2008 | Rinerson | |
| 2008/0089127 A1 | 4/2008 | Mokhlesi | |
| 2008/0175032 A1 | 7/2008 | Tanaka et al. | |
| 2009/0141547 A1 | 6/2009 | Jin | |
| 2009/0168503 A1 | 7/2009 | Fackenthal | |
| 2009/0168523 A1 | 7/2009 | Shirakawa | |
| 2009/0273054 A1 | 11/2009 | Kim | |
| 2010/0027316 A1 | 2/2010 | Yoon | |
| 2010/0046267 A1 | 2/2010 | Yan | |
| 2010/0072445 A1 | 3/2010 | Schricker et al. | |
| 2010/0085098 A1 | 4/2010 | Ferguson | |
| 2010/0155858 A1 | 6/2010 | Chen | |
| 2010/0259961 A1 | 10/2010 | Fasoli | |
| 2010/0259962 A1 | 10/2010 | Yan | |
| 2011/0147806 A1 | 6/2011 | Wilson | |
| 2011/0297912 A1 | 12/2011 | Samachisa et al. | |
| 2012/0147644 A1 | 6/2012 | Scheuerlein | |
| 2012/0147648 A1 | 6/2012 | Scheuerlein | |
| 2012/0147649 A1 | 6/2012 | Samachisa | |
| 2012/0147650 A1 | 6/2012 | Samachisa | |
| 2012/0182807 A1 | 7/2012 | Lue | |
| 2012/0228712 A1 | 9/2012 | Jeong et al. | |
| 2013/0126821 A1 | 5/2013 | Sekar et al. | |
| 2013/0148400 A1 | 6/2013 | Murooka | |
| 2013/0272069 A1 | 10/2013 | Rabkin et al. | |
| 2013/0308363 A1 | 11/2013 | Scheuerlein et al. | |
| 2013/0322174 A1 | 12/2013 | Li et al. | |
| 2014/0048761 A1 | 2/2014 | Nojiri et al. | |
| 2014/0248763 A1 | 9/2014 | Konevecki et al. | |
| 2014/0252454 A1 | 9/2014 | Rabkin et al. | |
| 2015/0249112 A1 | 9/2015 | Takeguchi et al. | |
| 2015/0255619 A1 | 9/2015 | Shimabukuro | |

FOREIGN PATENT DOCUMENTS

| | | |
|---|---|---|
| WO | WO2012/082770 A1 | 6/2012 |
| WO | WO2012/082775 A1 | 6/2012 |

OTHER PUBLICATIONS

U.S. Appl. No. 14/195,636, filed Mar. 3, 2014.

Hung et al., "A Highly Scalable Vertical Gate (VG) 3D NAND Flash with Robust Program Disturb Immunity Using a Novel PN Diode Decoding Structure," 2011 Symposium on VLSI Technology Digest of Technical Papers, Jun. 2011, pp. 68-69, 2 pages.

Kalkofen et al., "A simple two-step phosphorus doping process for shallow junctions by applying a controlled adsorption and diffusion in an oxidising ambient," Materials Science and Engineering, Symposium B, Dec. 2004, pp. 362-366, vols. 114-115, Elsevier B.V., 5 pages.

Viazzocchi et al., "Boron and Phosphorus dopant activation in germanium using Laser annealing with and without preamorphization implant," 17th IEEE International Conference on Advanced Thermal Processing of Semiconductors, RTP 2009, Sep. 29-Oct. 2, 2009, 5 pages.

Paviet-Salomon et al., "Experimental and analytical study of saturation current density of laser-doped phosphorus emitters for silicon solar cells," Solar Energy Materials & Solar Cells, Aug. 2011, pp. 2536-2539, vol. 95, Issue 8, Elsevier B.V., 4 pages.

\* cited by examiner

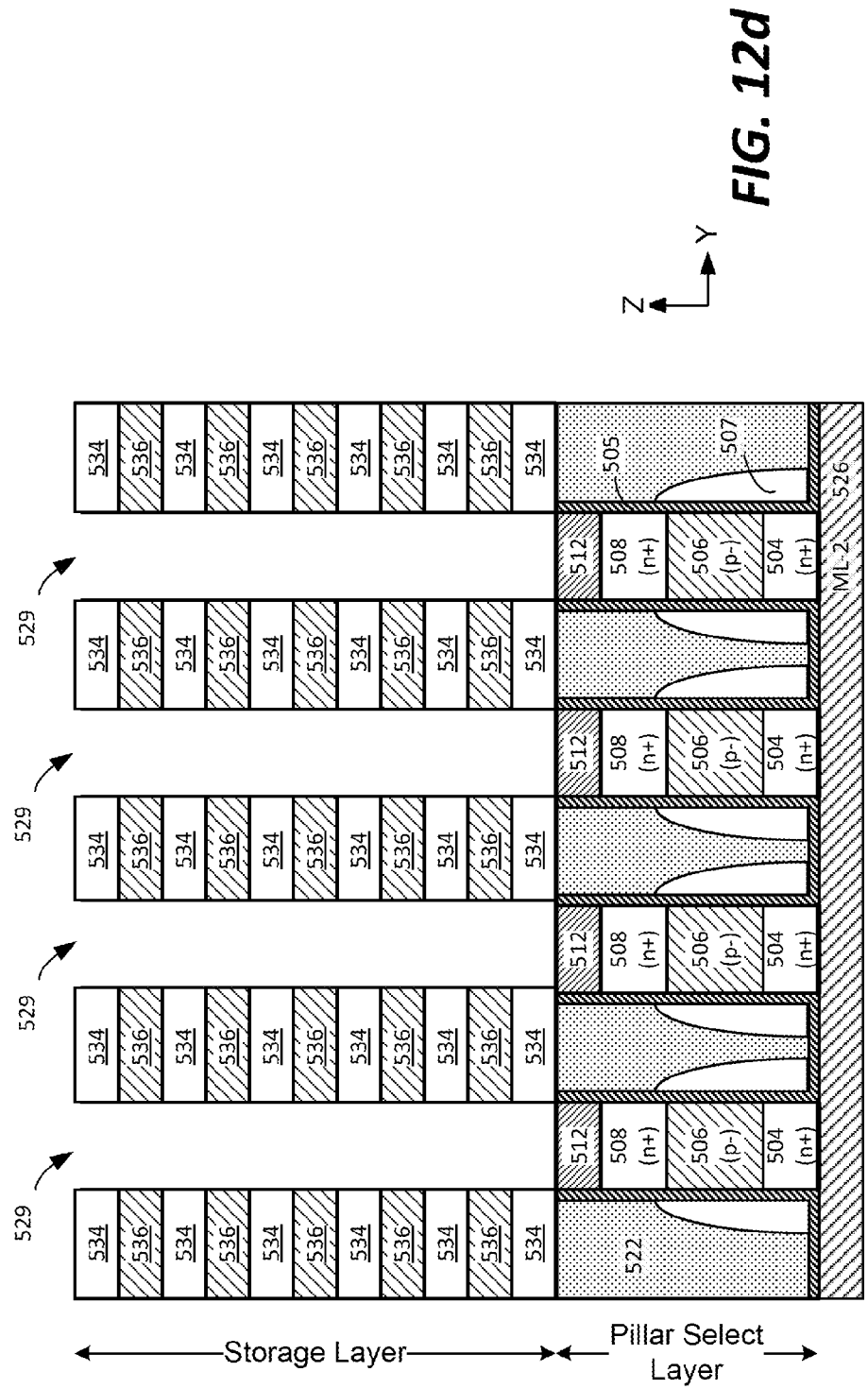

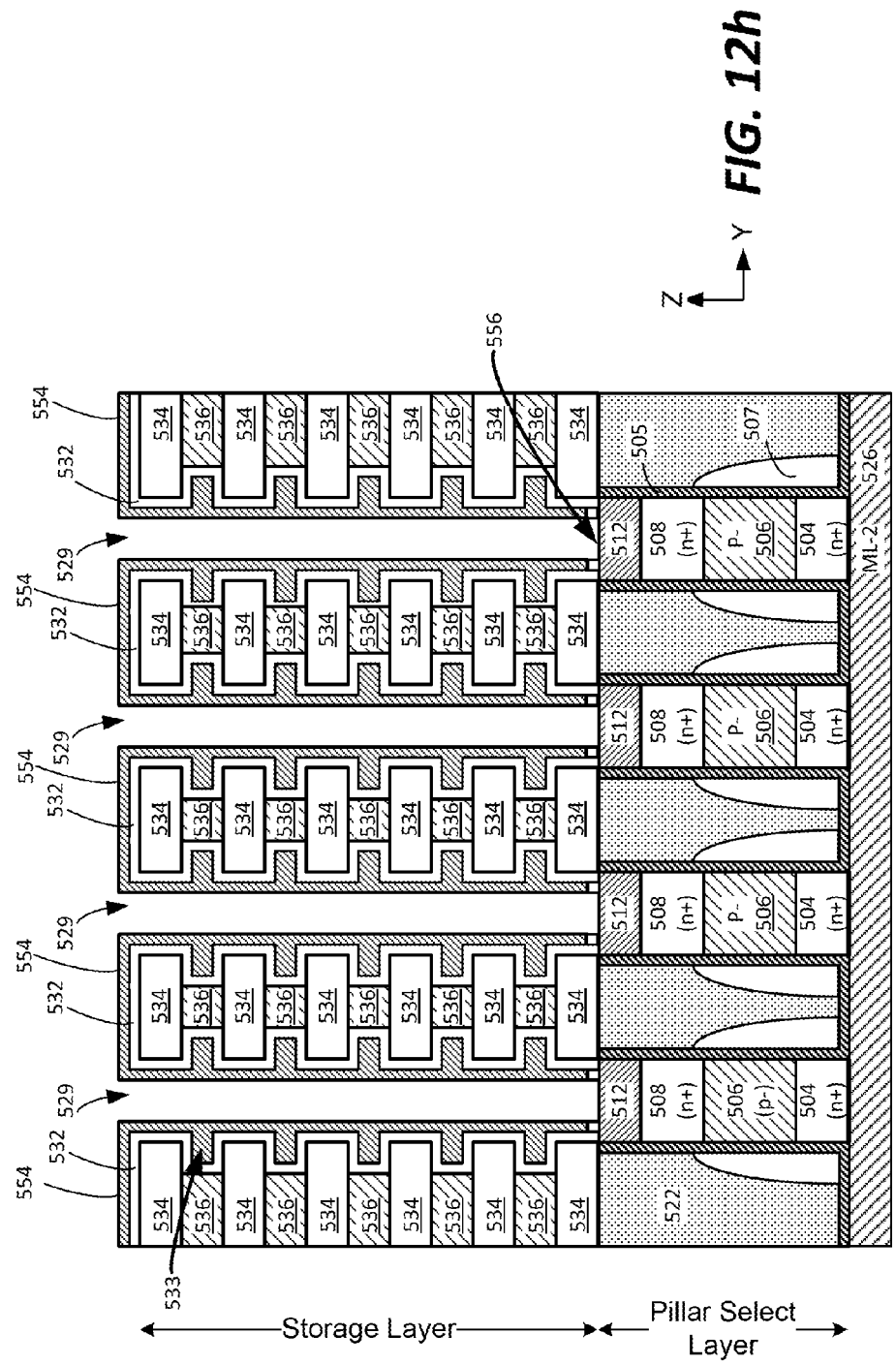

VERTICAL BIT LINE NON-VOLATILE MEMORY WITH RECESSED WORD LINES

BACKGROUND OF THE INVENTION

The present disclosure relates to technology for non-volatile storage.

One example of non-volatile memory uses variable resistance memory elements that may be set to either low or high resistance states. Upon application of sufficient voltage, current, or other stimulus, the variable resistance memory element switches to a stable low-resistance state, which is sometimes referred to as SETTING the device. This resistivity-switching is reversible such that subsequent application of an appropriate voltage, current, or other stimulus can serve to return the reversible resistivity-switching material to a stable high-resistance state, which is sometimes referred to as RESETTING the device. This conversion can be repeated many times.

The variable resistance memory elements may be in an undetermined state when first manufactured. This may be referred to as the "virgin state." In the virgin state, the resistance could be higher than for the RESET state for example. The term "FORMING" is sometimes used to describe putting the variable resistance memory elements into a lower resistance state for the first time. For some memory elements, the FORMING operation requires a higher voltage than the SET and/or RESET operations.

3D memory arrays having variable resistance memory elements have been proposed. In one possible architecture, word lines extend horizontally and bit lines extend vertically. There a multiple levels of the word lines, hence multiple levels of memory elements. Each memory element is located between one of the vertical bit lines and one of the horizontal word lines. During operation, some of the memory cells are selected for the SET, RESET, or FORM operation, while others are unselected.

BRIEF DESCRIPTION OF THE DRAWINGS

FIGS. 12a-12j are perspective and cross-sectional views depicting a three-dimensional memory structure that can be fabricated using the process of FIG. 11 according to one embodiment of the disclosure.

DETAILED DESCRIPTION

Figure 1:
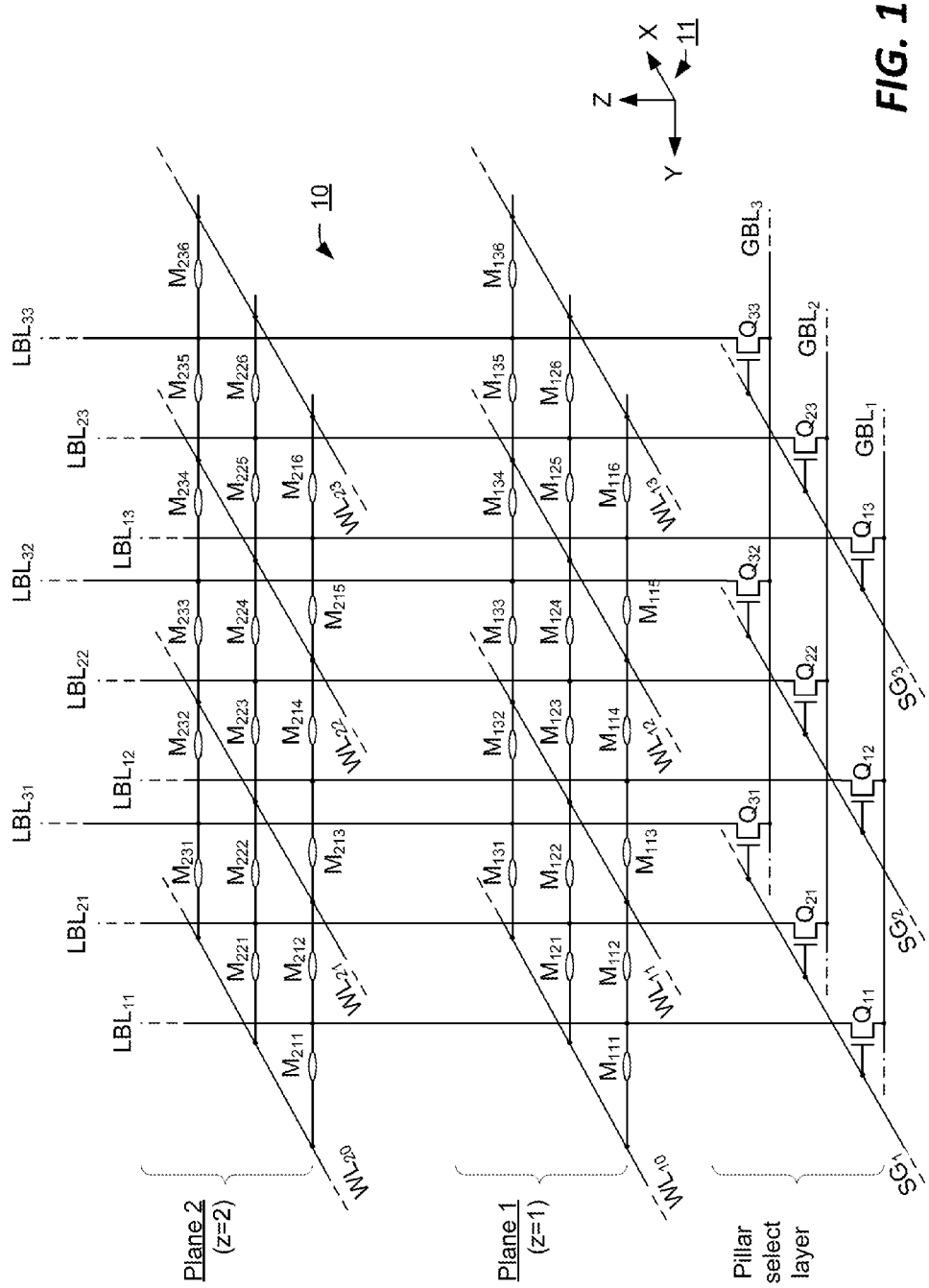
FIG. 1 is an equivalent circuit for a portion of an example three-dimensional array of variable resistance memory elements including a vertical bit line architecture with vertical TFT select devices.

The disclosed technology is directed to a three-dimensional (3D) non-volatile memory array having a vertically-oriented thin film transistor (TFT) select device and methods of fabricating 3D memories. The vertically-oriented TFT select device, or more simply vertical TFT, may be used as a vertical bit line select device in one embodiment, coupling a global bit line to a local vertical bit line. A select device pillar includes a body and upper and lower source/drain regions. At least one gate is separated horizontally from the select device pillar by a gate dielectric.

A three-dimensional (3D) non-volatile memory array is provided having multiple word line layers stacked vertically with interleaving insulating layers over a vertical TFT. The vertical TFT is used as a bit line selection device to couple a global bit line to a vertical bit line formed in a trench between portions of the word line and insulating layer stack. The word line layers are recessed horizontally to form recesses relative to the vertical bit line trench. The horizontal recess of the word lines provides a recessed memory cell area with spatial separation from surfaces exposed during later process steps. A memory material is formed conformally within the recesses, followed by a thin protective film. After forming the protective film, the horizontal portions of the protective film and memory material are etched to expose an upper surface of the vertical TFT, such as a conductive hard mask region overlying an upper S/D region of the TFT. The vertical bit line material is formed in the remaining portions of the trench, contacting the vertical TFT at the bottom of the trench.

By recessing the word lines, the memory material can be formed between overhangs of the insulating material above and below the recess. The memory material is formed along the vertical sidewall of the word line in the recess. The memory material at this position is separated in the horizontal direction from the vertical sidewalls of the insulating lines. The protective film is formed in remaining portions of the word line recesses after forming the memory material. The protective film is formed optionally along the vertical sidewalls of the insulating lines. Because of the word line recesses in which the memory material is formed, a thin film is capable of providing adequate protection of the memory cell areas during later process steps.

The protective film may form part of the vertical bit line film stack. The vertical bit line includes a body extending vertically from the upper surface of the TFT. The body may be formed principally of the vertical bit line material formed after etching back the memory material. The body may also include portions of the protective film. The vertical bit line includes horizontal protrusions that extend laterally from the body toward the word lines. Each horizontal protrusion extends into a corresponding word line recess. In this manner, the vertical sidewall of the horizontal protrusions is smaller in the vertical direction, relative to the word lines. This shrinks the memory cell area, which is defined by the vertical sidewall of the word line and adjacent area of the vertical bit line. The smaller cell area may permit smaller voltages and currents for program, read, and erase operations. The horizontal protrusions can be formed from the protective film, as well as from the vertical bit line material.

In one embodiment, the vertical TFT is used as a bit line selection device in a three-dimensional (3D) array of memory elements where bit lines of the array are oriented vertically. That is, instead of stacking a plurality of two-dimensional arrays on a common semiconductor substrate, where each two-dimensional array has its own bit lines, multiple two-dimensional arrays are stacked on top of each other in separate planes but then share common bit lines that extend up through the planes. As a selection device, the vertical TFT may be referred to as a select gate or decoder. Memory elements in a 3D memory array may be controlled by applying proper voltages to their vertical bit lines and word lines. By applying either a select voltage or an unselect voltage to the vertical bit lines, while applying either a select voltage or an unselect voltage to the horizontal word lines, memory cells are selected/unselected for operations such as SET, RESET, and FORM. The vertical TFT selection device provides the proper voltage to the vertical bit line.

In FIG. 1, an architecture of a three-dimensional memory 10 is described using a schematic of an equivalent circuit of a portion of the 3D memory. A standard three-dimensional rectangular coordinate system 11 is used for reference, the directions of each of vectors x, y and z being orthogonal with the other two. In another embodiment direction x and y are substantially 60 degrees from each other. The array in FIG. 1 includes vertical bit lines.

A circuit for selectively connecting internal memory elements with external data circuits is formed using select devices $Q_{xy}$, where x gives a relative position of the device in the x-direction and y its relative position in the y-direction. The individual select devices $Q_{xy}$ are vertical TFTs in accordance with embodiments. Global bit lines ($GBL_x$) are elongated in the y-direction and have relative positions in the x-direction that are indicated by the subscript. The global bit lines ($GBL_x$) are individually connectable with the source or drain of the vertical TFT select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of vertical TFT select devices $Q_{xy}$ having a common position in the y-direction. The vertical TFT select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the vertical TFT select devices to which it is connected. The remaining row select lines receive voltages that keep their connected vertical TFT select devices $Q_{xy}$ off. It may be noted that since only one vertical TFT select device ($Q_{xy}$) is used with each of the local bit lines ($LBL_{xy}$), the pitch of the array across the semiconductor substrate in both x and y-directions may be made very small, and thus the density of the memory storage elements large.

In other embodiment, more than one vertical TFT select device may be used for a vertical bit line. For example, more than one vertical TFT select device may be stacked upon one another. In another example, one vertical TFT select device may be formed above a vertical bit line and another vertical TFT select device may be formed below the vertical bit line.

Memory elements $M_{zxy}$ are formed in a plurality of planes positioned at different distances in the z-direction above a substrate (which may be below the pillar select layer). Two planes 1 and 2 are illustrated in FIG. 1 but there will typically be additional planes such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. After the device is first fabricated, voltages may be selected to provide the electrical stimulus necessary to "form" the memory element, which refers to lowering its resistance from a virgin state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, may be monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

The material used for the non-volatile memory elements $M_{zxy}$ in the arrays described herein can be a chalcogenide, a metal oxide, CMO, or any one of a number of materials that exhibit a stable, reversible shift in resistance in response to an external voltage applied to or current passed through the material. Other materials can also be used. The technologies described below are not restricted to any one set of materials for forming the non-volatile memory elements.

By way of example, metal oxides are characterized by being insulating when initially deposited. One suitable metal oxide is a titanium oxide ($TiO_x$). A composite structure can be formed in a non-conductive (high resistance) state. When a large negative voltage (such as 1.5 volt) is applied across the structure, a relatively high current can flow through the structure. The device is then in its low resistance (conductive) state. The conductive path is broken by applying a large positive voltage across the structure. The device returns to its high resistance state. Both of the conductive and non-conductive states are non-volatile. Examples of other oxide materials that can be used for the non-volatile memory elements $M_{zxy}$ in the array include HfOx, ZrOx, WOx, NiOx, CoOx, CoAlOx, MnOx, $ZnMn_2O_4$, ZnOx, TaOx, NbOx, HfSiOx, HfAlOx, or combinations thereof.

Another class of materials suitable for the memory storage elements includes solid electrolytes. They are electrically conductive when deposited. Individual memory elements can be formed and isolated from one another. Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W.

Carbon may also be used as a non-volatile memory element. Carbon is usually used in two forms, conductive (or grapheme like-carbon) and insulating (or amorphous carbon). The operation of a carbon resistive switching nonvolatile memories involves transforming chemical bond configurations by applying appropriate current (or voltage) pulses to the carbon structure. For example, when a very short high amplitude voltage pulse is applied across the material, the conductance is greatly reduced as the carbon may be in an amorphous state. On the other hand, when in the reset state, applying a lower voltage for a longer time causes part of the material to change into the conductive state. Carbon nanotubes (CNTs) may be used as a non-volatile memory material. Such nanotubes can demonstrate very high conductivity. When an electric field is applied across this fabric, the CNT's tend to flex or align themselves such that the conductivity of their fabric is changed.

Yet another class of materials suitable for the memory storage elements is phase-change materials. A group of phase-change materials may include chalcogenide glasses, often of a composition $Ge_xSb_yTe_z$, where x=2, y=2 and z=5. GeSb may also be used. Other materials include AgInSbTe, GeTe, GaSb, BaSbTe, InSbTe and various other combinations of these basic elements. When a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form polycrystal phases of high conductivity.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines can be made of the conductive materials described above. In embodiments using additional conductive segments for at least one of the two memory element electrodes, those segments can be made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where steering elements are included. The diode can be a p-n junction (not necessarily of silicon), a metal/insulator/insulator/metal (MIIM), or a Schottky type metal/semiconductor contact but can alternately be a solid electrolyte element.

For simplicity the above description has considered the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC).

Additional information regarding the various memory materials that may be used can be found in U.S. patent application Ser. No. 13/788,990, entitled Vertical Bit line TFT Decoder for High Voltage Operation," filed Mar. 7, 2013 and incorporated by reference herein in its entirety.

Figure 2:
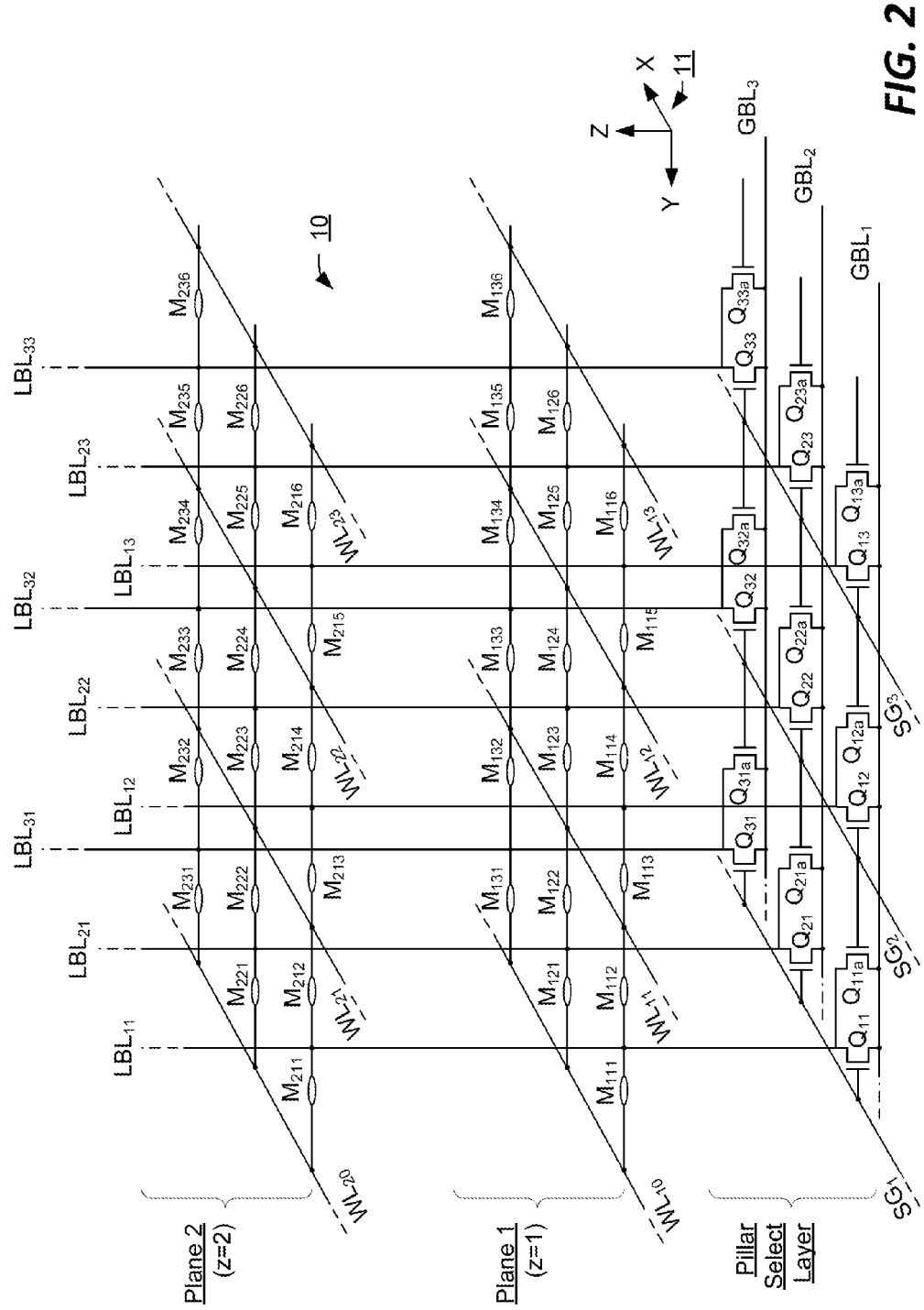
FIG. 2 is an equivalent circuit for a portion of another example three-dimensional array of variable resistance memory elements.

FIG. 2 is a partial schematic of a three-dimensional memory 10 that includes a double-gated structure for the vertically oriented TFT select devices Qxy. Planes 1 and 2 of FIG. 2 are the same as in FIG. 1. As can be seen, each local bit line LBL is connectable to a respective global bit line GBL by two row select signals. FIG. 2 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line $GBL_1$ in response to row select line $SG_2$. The same structure is used for the other local bit lines depicted in FIG. 2.

Figure 3:
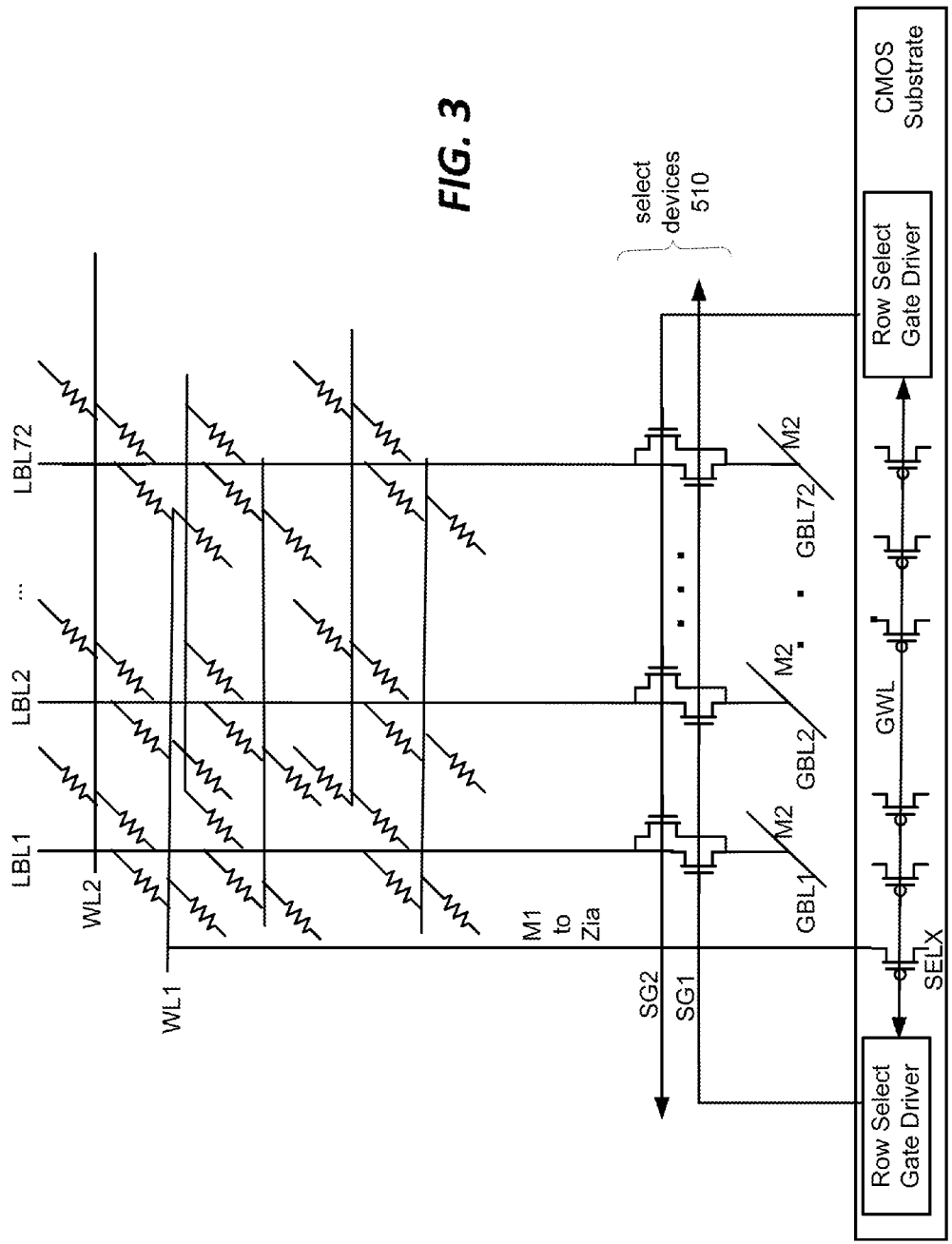
FIG. 3 is a schematic of a portion of a memory system, depicting vertical bit lines, vertically oriented select devices above the substrate and row select line drivers in the substrate.

FIG. 3 shows another partial schematic also depicting the double-gated structure such that the local bit lines (LBL1, LBL2, LBL72) are connected to their respective global bit lines (GBL1, GBL2, GBL72) by any of two respective vertically oriented TFT select devices that are positioned above a CMOS substrate. As can be seen, while the double-gated structure includes positioning the various select devices 510 above the substrate, the Row Select Line Drivers providing the row select lines $SG_1$, $SG_2$, ... are positioned in the substrate. Similarly, the global word lines (e.g., GWL) are position in a metal layer on the substrate and below the vertically oriented select devices. Furthermore, the Row Select Line Driver uses the appropriate global word line GWL as an input in one embodiment.

Figure 4:
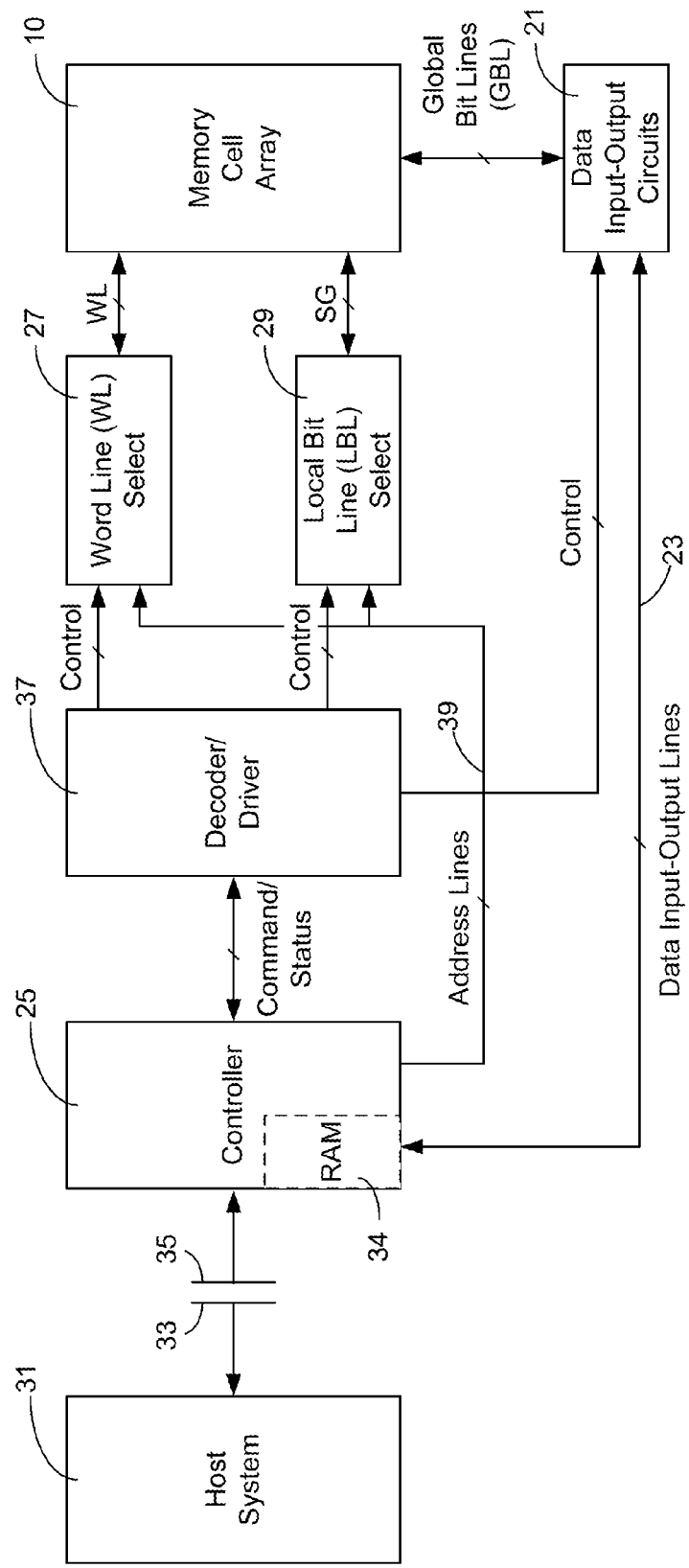
FIG. 4 is a schematic block diagram of a re-programmable non-volatile memory system which can utilize the memory arrays of FIGS. 1-3, and which indicates connection of the memory system with a host system.

FIG. 4 is a block diagram of an illustrative memory system that can use the three-dimensional memory 10 of FIGS. 1-3. Data input-output circuits 21 are connected to provide (during programming) and receive (during reading) analog electrical quantities in parallel over the global bit-lines $GBL_x$ that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIGS. 1-3, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the local bit line select circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although each of the memory elements $M_{zxy}$ in the array of FIGS. 1-3 may be individually addressed for changing its state according to incoming data or for reading its existing storage state, it may be preferable to program and read the array in units of multiple memory elements in parallel. One row of memory elements on one plane may be programmed and read in parallel, for example. The number of memory elements operated in parallel depends on the number of memory elements connected to the selected word line. In some arrays, the word lines may be segmented (not shown in FIGS. 1-3) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is may be preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to flash memory arrays. Resetting a block of memory elements to a common state corresponds to erasing a block of flash memory elements to an erased state. The individual blocks of memory elements may be further divided into a plurality of pages of storage elements. The memory elements of a page can be programmed and read together. This is similar to the use of pages in flash memories. The memory elements of an individual page are programmed and read together. When programming, those memory elements that are to store data that are represented by the reset state are not changed from the reset state. Those of the memory elements of a page that need to be changed to another state in order to represent the data being stored in them have their states changed by the programming operation. Example resetting, programming (e.g., setting) and reading operations of a memory array like that of FIGS. 1-3 can be found in U.S. patent application Ser. No. 13/788,990, entitled Vertical Bit line TFT Decoder for High Voltage Operation," filed Mar. 7, 2013 and incorporated by reference herein in its entirety.

Figure 5:
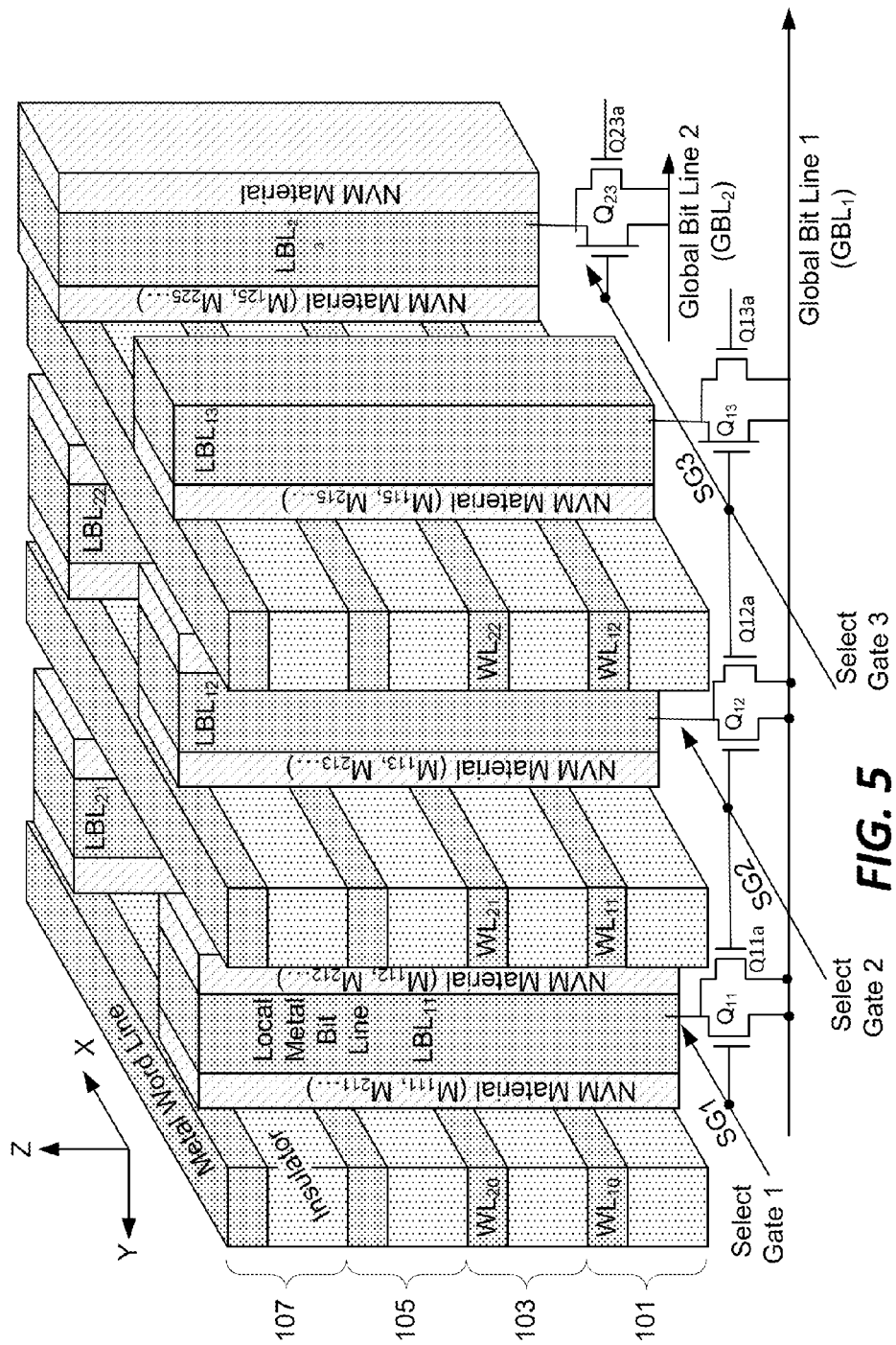
FIG. 5 is an isometric view of a portion of the three-dimensional array shown in FIG. 2 according to a one example of an implementation.

One example semiconductor structure for implementing a three-dimensional memory element array of FIG. 2 is illustrated in FIG. 5 which is configured for use of non-volatile memory (NVM) material that is non-conductive when first deposited. A metal oxide can be used for this characteristic in one example. Since the material is initially non-conductive, the memory elements at the cross-points of the word and bit lines are isolated from each other. Several memory elements may be implemented by a single continuous layer of material, which in the case of FIG. 5 are strips of NVM material oriented vertically along opposite sides of the vertical bit lines in the y-direction and extending upwards through all the planes. A significant advantage of the structure of FIG. 5 is that all word lines and strips of insulation under them in a group of planes may be defined simultaneously by use of a single mask, thus greatly simplifying the manufacturing process.

A small part of four planes 101, 103, 105 and 107 of the three-dimensional array are shown. Elements of the FIG. 5 array that correspond to those of the equivalent circuit of FIG. 1 are identified by the same reference numbers. It will be noted that FIG. 5 shows the two planes 1 and 2 of FIG. 3 plus two additional planes on top of them. All of the planes have the same horizontal pattern of conductor, dielectric and NVM material. In each plane, metal word lines (WL) are elongated in the x-direction and spaced apart in the y-direction. The word lines may also be formed of polysilicon or other materials. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) running in the y-direction at the same pitch as the pillar spacing through the vertical TFT select devices ($Q_{xy}$) whose gates are driven by the row select lines (SG) elongated in the x-direction. The vertical TFT select devices have a channel extension, in one embodiment.

Not shown in FIG. 5 are sense amplifiers, input-output (I/O) circuitry, control circuitry, and other peripheral circuitry. There is one row select line (SG) for each row of local bit line pillars in the x-direction and two vertical TFT select device (Q) for each individual vertical local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines. In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element does not conduct a significant amount of current. Similarly, in other embodiments, the non-conducting NVM material may be left in place between adjacent local bit lines if the operating voltages between the adjacent LBLs remain below the programming threshold. The NVM material may also be left in place if the spacing between the LBLs is larger than the NVM thickness in the cell.

To enable the memory to be denser (e.g., more memory elements per area), the size of the memory elements can be made small and the memory elements can be arranged close to each. To enable the memory elements to be close to each other, one embodiment uses a vertically oriented TFT decoder for connecting the individual local vertical bit line pillars to the respective global bit lines. In one embodiment, each vertically oriented TFT select device is a pillar select device that is formed as a vertical structure, switching between a local bit line pillar and a global bit line. The vertical TFT select devices, are in the present embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented TFT select devices above, but not in, the substrate allows the memory elements to be arranged in a more compact fashion, thereby increasing density. Additionally, positioning the vertically oriented TFT select devices above the substrate allows for other devices (e.g., the word line drivers) to be positioned in the substrate under the memory array rather than outside of the array, which allows the integrated circuit to be smaller.

For example, a pillar shaped vertical Thin Film Transistor (TFT) can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 6:
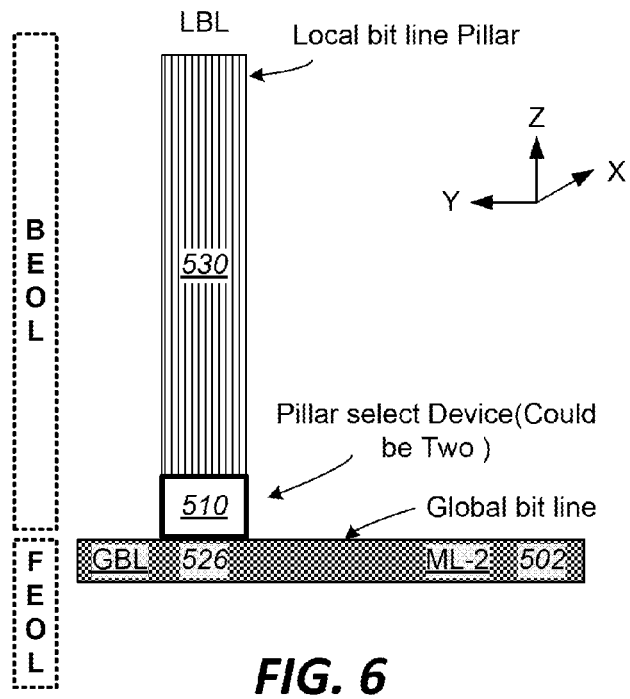
FIG. 6 is a plan view that depicts a vertical bit line, a vertically oriented select device and a global bit line.

FIG. 6 illustrates the structure of a vertically oriented TFT select device in relation to the local bit line and the global bit line. The 3D memory 10 is formed on top of a CMOS substrate (not shown explicitly) where structures in the CMOS are referred to as being in the FEOL ("Front End of Lines"). The vertically oriented TFT select devices switch individual vertical bit lines (that are above and not in the substrate) to individual global bit lines that are formed on top of the FEOL layer in the BEOL ("Back End of Lines"). Thus, the BEOL includes the pillar select layer with the memory layer on top of it. The vertically oriented TFT select devices (such as $Q_{11}$, $Q_{12}$, . . . , $Q_{21}$, $Q_{22}$, etc.) are formed in the pillar select layer as vertically oriented TFT select devices. The pillar select layer is formed above (and not in) the substrate. The vertically oriented TFT select device may switch a local bit line to a global bit line. In the example, the local bit line LBL 530 is switchable to the global bit line GBL 526 by a vertically oriented TFT select transistor 504 such as $Q_{11}$. The gate of the TFT select transistor $Q_{11}$ is controllable by a signal exerted on a row select line $SG_1$ (not shown).

The global bit line such as GBL 526 is formed below the vertically oriented TFT select device, in the FEOL as part of the metal layer-1 or metal layer-2 502. The vertically oriented TFT select device is formed in the BEOL layer on top of the GBL 526 (and above, but not in, the substrate). The local bit line LBL 530, in the form of a pillar, is formed on top of the vertically oriented select device 504. In this way, the vertically oriented TFT select device 504 can switch the local bit line pillar LBL to the global bit line GBL.

Figure 7:
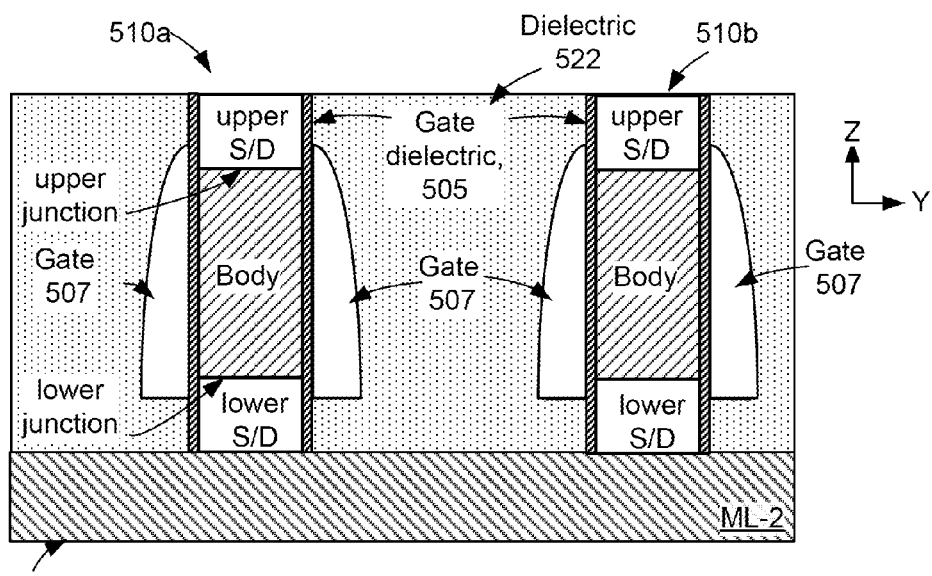
FIG. 7 depicts the structure of two vertical TFT selection devices in accordance with one embodiment.

FIG. 7 depicts an example of a vertical TFT selection device that can be used with embodiments of the disclosure. Two vertical TFT selection devices 510a and 510b are illustrated which may be used for selecting vertically oriented bit lines (not shown). Each vertical TFT selection device 510a, 510b has two source/drain (S/D) regions. The source/drain regions are on either side of the body. The source/drain regions and body are polysilicon in one embodiment. The vertically oriented TFT select devices 510a, 510b have an upper junction between the body and upper S/D and a lower junction between the body and lower S/D.

In some embodiments, the body and the S/D regions are of opposite conductivity. For example, the body may be p– and each S/D N+. As another example, the body may be n– and each S/D P+. Thus, the TFT could be an enhancement NFET (N+ p– N+) or enhancement PFET (P+ n–P+), as two examples. In some embodiments, the body and the S/D regions have the same conductivity. For example, the body may be p– and each S/D P+. As another example, the body may be n– and each S/D N+. Thus, the TFT could be a depletion type N+ n– N+ (NFET) or depletion type P+ p– P+ (PFET), as two examples. For depletion type devices, N+ n– N+ (NFET) and P+ p– P+ (PFET), the level of conductivity of each S/D may be much higher than that of the body. In one embodiment, the S/D net doping concentration is 3-4 orders of magnitude greater than the body net doping concentration.

Each of the vertical TFT selection devices 510a, 510b has two gates 507 and a dielectric material 505 separating each gate from the body and S/D regions. This dielectric may be referred to as a gate dielectric as it separates gates 507 from the body and S/D regions. In one embodiment, the gate dielectric 505 extends along the sides of the source/drain regions and the body or each selection device. The gate dielectric can be elongated in the x-direction along the vertical sidewalls of the pillar structure including the body and S/D regions. In other examples, the TFT selection devices may share gates (e.g., between two adjacent selection devices). Additionally, gate-all-around configurations may be used.

The gate dielectric separates the gates from either the body or the source/drain regions, as the case may be. In this example, each gate 507 extends vertically from below the lower junction to above the upper junction. That is, the gates 507 are formed directly adjacent to the vertical extent of the body and directly adjacent to a portion of the vertical extent of both S/D regions. The lower source/drain is connected to a global bit line in this embodiment. The upper source/drain can be connected to a vertically oriented bit line (not depicted in FIG. 7).

Note that the vertical bit line material may serve as one of the electrodes of read-write memory elements. In some embodiments, the material of the vertical BL is N+ poly. For some types of memory cells, N+ poly serves as a good electrode choice (on the BL side) to achieve desired operation of a specific memory cell and memory array. For other memory cells with different material composition, P+ poly may be chosen as an electrode (on BL side) for desired operation of the memory cell and array. The P+ polysilicon work function is different from N+ polysilicon, and may be more suitable for the electrode material to enable the most efficient memory cell operation. In this latter case, a PFET TFT selection device may be preferable due to its source/ drain being P+ (thus matching the vertical bit line). Accordingly, reference to the global bit line 526 or vertical bit line may include reference to such electrodes included with other bit line material such as metals. For example, global bit line 526 may refer to a metal global bit line alone, a semiconductor global bit line along, or a combination of the two materials, such as an N+ or P+ material overlying a metal line.

A gap fill dielectric 522 such as an oxide is formed between adjacent select devices as an insulating material. Under each gate 507, the gap fill dielectric 522 extends vertically from a lower surface or endpoint region of each gate 507 to an upper surface of the global bit line 526. In another example, the gate dielectric 505 may be formed over the global BL 526 such that the gap fill dielectric 522 extends from an upper surface of the gate dielectric to a lower surface of each gate.

Between adjacent gates 507, dielectric 522 extends vertically from an upper surface of global BL 526 (or gate dielectric 505) to at least the level of the upper surface of the upper source/drain region. Dielectric 522 can be formed in a single process step to both fill the area or void beneath each gate, as well as to fill the areas between adjacent gates. In another example, the gates may sit or overlie a dielectric base that is formed separately from the dielectric 522. In such an example, the gate dielectric may overlie the separately formed base or be formed beneath it. In yet another example, the gate dielectric can be formed along the upper surface of the global bit line and the lower surface of the gate 507 may contact the gate dielectric directly such that no additional dielectric material such as 522 is formed therebetween.

Figure 8:
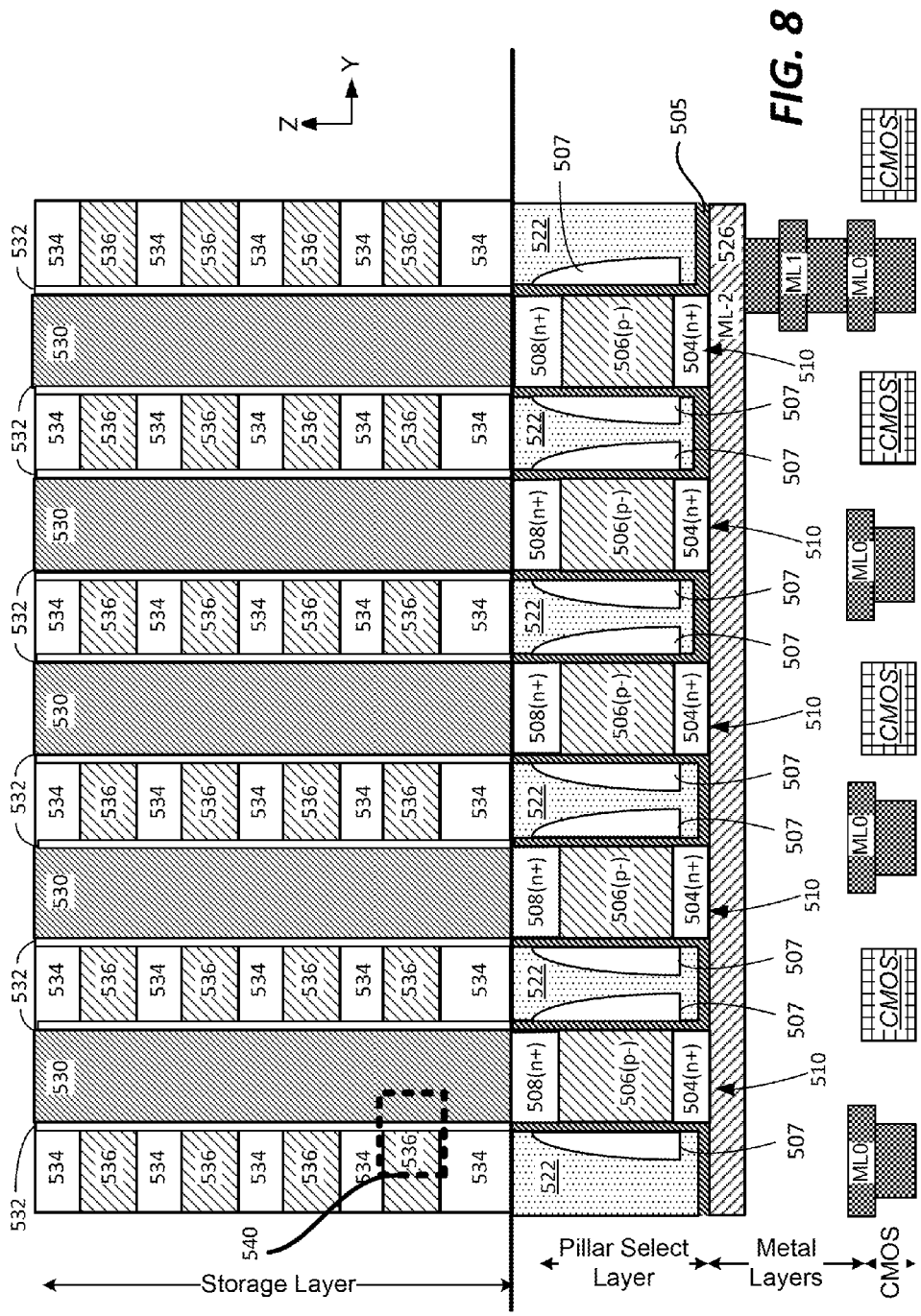
FIG. 8 is a cross-sectional view of a memory structure including one example of a vertically oriented TFT selection device and the memory structure of FIG. 5.

FIG. 8 is a cross-sectional view of a memory structure using a vertically oriented TFT select device 504 as shown in FIG. 7 with the memory structure of FIG. 5. FIG. 8 shows ten gates 507 in a gate material layer, each underneath a stack of multiple word lines. As can be seen, two gates are positioned between pairs of vertically oriented select devices 504, above and not in the substrate. Each select device includes two gates, one on each side formed along a vertical sidewall of the pillar structure. The gates 507 extend horizontally in the x-direction (not shown) and can form row select lines $SG_x$ as shown in FIGS. 1-5.

The memory layer includes a set of vertical bit lines 530 (e.g., comprising N+ polysilicon). Interspersed between the vertical bit lines 530 are alternating layers of insulating lines 534 (e.g., oxide) and layers of word lines 536. In one embodiment, the word lines are made from TiN. Between the vertical bit lines 530 and the stacks of alternating oxide lines 534 and word lines 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate.

Directly below each vertical bit line 530 is one of the vertically oriented TFT select devices 510, each of which comprises (in one example embodiment) an n+/p–/n+ TFT. Each n+ region may be referred to as a source/drain. The p– region may be referred to as a body. The p– region may serve as the channel of the TFT during operation. As noted above, other conductivities can be used in the TFT selection device, with suitable changes to other elements in the memory array.

Each of the vertically oriented TFT select devices 504 includes a gate dielectric 505 on each side. The dielectric 505 is oxide in one embodiment. In this embodiment, each TFT has two gates. There is a gate 507 to the left and a gate 507 to the right of the TFT body. The gate dielectric extends horizontally between adjacent select devices over the upper surface of the underlying global bit line 526 in this example.

In FIG. 8, the channel is not extended on the top of the TFT 510 or on the bottom of the TFT 510. That is, the p– region of each TFT 510 does not extend above the upper surface or portion of gate material 507, nor does the p–region of each TFT 510 extend below the lower surface of portion of gate material 522. However, the vertical TFT selection device 510 may have a channel extension in other embodiments. The channel extension may be formed either at the upper portion or lower portion. The body region extends past the gates in such an embodiment. The channel may be extended on the top or the bottom of the TFT 510. That is, the body region does not extend past the gates at either the lower junction or the upper junction. Thus, the gates are offset from the upper junction or lower junction in this embodiment. By the gate being offset from the junction, it is meant that that the gate is not directly adjacent to the junction. For example, the gates may not be directly adjacent to the upper junction or not directly adjacent to the lower junction. Another way of stating the foregoing is that the top portion of the gates does not extend above the upper junction, or the bottom portion of the gates does not extend below the lower junction. In the case the top or/and bottom portion of the gates extend beyond the junction, the structure has respective gate junction overlap, or gate-source or/and gate/drain overlap. More detail regarding structures with a channel offset can be found in U.S. application Ser. No. 13/788,990, referenced above.

The memory structure of FIG. 8 is a continuous mesh array of memory elements because there are memory elements connected to both sides of the bit lines and memory elements connected to both sides of the word lines. At the bottom of FIG. 8, the CMOS substrate is depicted. Implemented on the top surface of the CMOS structure are various metal lines including ML-0, ML-1, and ML-2. Line 526 of ML-2 serves as a respective global bit line (GBL). The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 507 can be polysilicon, Titanium Nitride, Tantalum Nitride, Nickel Silicide or any other suitable material. Gate material 507 implements the row select lines $SG_x$ (e.g. $SG_1$, $SG_2$, . . . of FIG. 1), which are labeled in FIG. 8 as gates 507. Portions of the row select lines may also be referred to a transistor gates. In one embodiment, an N+ line overlies metal ML-2 serving as part of the global bit line.

The vertical memory structure including a vertical bit line 530 as shown in FIG. 8 presents various fabrication challenges. For example, vertical bit line 530 electrically couples to the upper node of the vertical TFT 510 to provide an electrical connection between the vertical bit line 530 and the global bit line 526. To provide an adequate electrical connection, the memory material 532 is removed from the upper surface of the upper node 508 of the vertical TFT select device.

An etch back process may be performed after conformally depositing the memory material 532 in some examples. However, the memory material 532 needs to be selectively removed from the upper surface of the vertical TFT select device, without being removed from the vertical sidewalls of the trenches. In some cases, a two-step vertical bit line layer deposition is used. After depositing the memory layer, a first layer of the vertical bit line material (e.g., n+ polysilicon) is deposited to form a liner over the memory material. The first layer is then etched back selectively to remove the material from the horizontal surface overlying the vertical TFT select device. A reactive ion etching process can be used in one embodiment. This first etch back stops on the memory material at the bottom of the trenches. A wet etch can then be applied to remove the horizontal portion of the memory layer at the bottom of the trench where the first layer of bit line material has been removed. For example, a HFO2 rewritable memory material can be removed by etching in dilute hydrofluoric acid (HF).

The reactive ion etching used to etch back the first bit line layer may have a higher etch rate at the top of the trenches relative to the bottom portion of the trenches. As a result, more protection of the memory layer may be needed at the top, which can be provided by increasing the thickness of the first layer. However, as the thickness of the film is increased, it may be more difficult to maintain the opening at the bottom of the trench as the trench sinks, while also maintaining enough of the first layer of bit line material to protect the memory layer.

Figure 9:
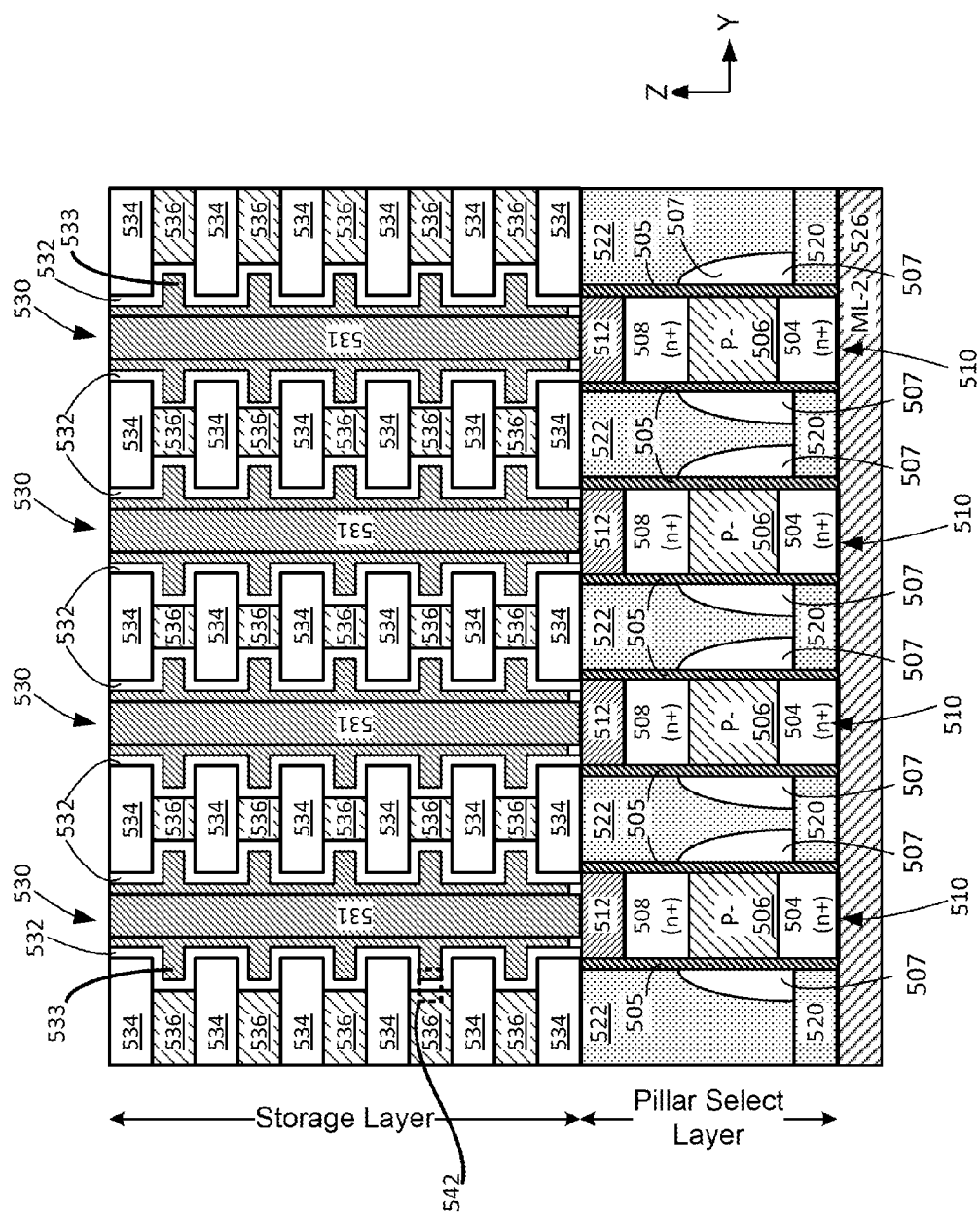
FIG. 9 is a cross-sectional view of a memory structure including a vertically oriented TFT selection device and a storage layer with recessed word lines and recessed memory cell areas according to one embodiment of the disclosure.

FIG. 9 is a cross-sectional view of a memory structure using a vertically oriented TFT select device 510 and storage layer in accordance with one embodiment. The cell area for each non-volatile storage element in the storage layer is recessed between adjacent insulating lines to provide protection of the memory layer during subsequent process steps after its formation. This recessed geometry constricts and thereby shrinks the cell area, and by extension the cell current and voltage needed to switch the memory cell between states.

The memory structure includes a pillar select layer as earlier described. Each vertical TFT select device 510 includes a gate dielectric 505 formed along the vertical sidewalls of lower S/D region 504, body 506, upper S/D region 508, and a conductive hardmask 512. The conductive hard mask provides a hard mask for etching, as well as an etch stop and polish stop during manufacturing. Additionally, the hard mask provides a good ohmic contact between the vertical TFT and the local bit line. The conductive hard mask 512 is optional and may be omitted in other examples. In this example, the gate dielectric extends along the sidewalls of regions 504, 506, 508, and 510, but not along the upper surface of the global bit line 526. In other examples, the gate dielectric 505 may extend over the global bit line 526 as shown in FIG. 8. Each TFT includes two gates 507, one being formed on the right side and one being formed on the left side. In this example, a dielectric bases 520 are formed under each gate 507, separately from the formation of the gap fill dielectric 522. Dielectric bases 520 may be formed over horizontal portions of the gate dielectric in embodiments as shown in FIG. 9. In one alternative, the dielectric bases may be formed prior to the gate dielectric, such that the gate dielectric material may extend over an upper surface of the dielectric bases between select gate pillars. In another example, gates 507 may be formed directly over horizontal portions of gate dielectric 505 without being formed over a base 520 or portion of the gap fill dielectric. Other vertical TFT select device structures and fabrication processes may be used.

Similar to FIG. 8, the storage layer includes a set of vertical bit lines 530. Interspersed between the vertical bit lines 530 are alternating layers of insulating lines 534 and word lines 536. A reversible resistance switch material forming a memory layer 532 is formed between the vertical bit lines 530 and the stacks of alternating insulating lines 534 and word lines 536. In FIG. 9, however, the word lines 536 in the storage layer are etched back so that the memory layer may be recessed between neighboring insulating lines 534, at positions adjacent to the corresponding word lines 536. Recesses or voids are formed between insulating layers by recessing the word lines. A non-volatile storage element is formed in each recess between an overhang of one insulating line underlying the storage element and an overhang of a neighboring insulating line overlying the storage element.

Box 542 depicts a cell area including one memory element which includes the reversible resistance switching material 532 sandwiched between a word line 536 and vertical bit line 530. The cell area underlies a portion of one insulating line 534 formed above and overlies a portion of another insulating line 534 formed below. The cell area is directly adjacent (laterally in the global bit line direction) to the recessed word line. The memory material is formed conformally so that it wraps around the insulating lines and accumulates on the vertical sidewall of each word line 536. The portion of the memory material adjacent to the word line forms the memory element. As illustrated, this portion of the memory material is spaced horizontally from the vertical sidewalls of the insulating lines formed above and below. By forming the memory element in the recess between insulating lines, the portion of the memory material at the cell area is protected from additional processing steps performed after depositing the memory material.

The vertical bit lines 530 in FIG. 9 include a body 531 that extends vertically from the underlying vertical TFT select device 510 and horizontal protrusions 533 that extend laterally from the body along the planes positioned at the different distances in the z-direction above the substrate. Note that a single protrusion 533 is labeled in FIG. 9 for clarity of presentation but it will be appreciated that a horizontal protrusion 533 extends laterally from the bit line body 531 within each recess. In each plane at a vertical distance z from the substrate, a corresponding word line 536 is elongated in the x-direction. A horizontal protrusion 533 from the body of the bit line extends in the x-direction toward the corresponding word line in the same plane. The horizontal protrusions extend beyond the vertical sidewalls of the overlying and underlying insulating lines. The horizontal protrusions terminate at a vertical sidewall facing and spaced apart from the vertical sidewall of the corresponding word line. The memory material 532 is sandwiched between the vertical sidewall of the horizontal protrusion of the bit line and the vertical sidewall of the recessed word line.

Figure 10B:
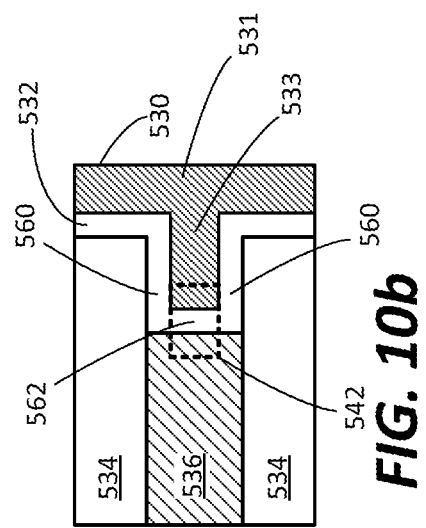
FIG. 10b is a cross-sectional view showing more detail of the memory cell structure in FIG. 9 according to one embodiment of the disclosure.
Figure 10A:
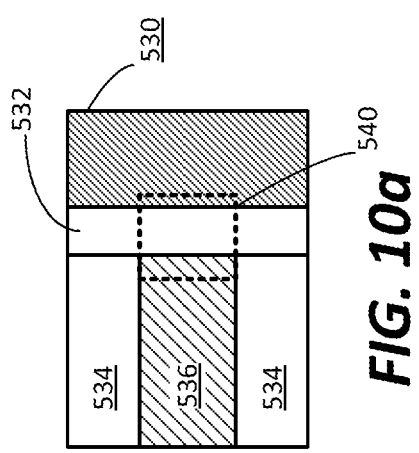
FIG. 10a is a cross-sectional view showing more detail of the memory cell structure in FIG. 8.

FIG. 10*a* is a cross-sectional view depicting more detail of one memory element as shown at box 540 in the memory structure of FIG. 8. FIG. 10*b* is a cross-sectional view depicting more detail of one memory element as shown at box 542 from the memory structure of FIG. 9 in accordance with one embodiment of the disclosure. In FIG. 10*a*, the memory layer 532 is formed vertically along the vertical sidewall of the word line 536 and the vertical sidewall of the vertical bit line 530. The memory element is formed from a portion of the memory layer 532 that is adjacent to both the vertical sidewall of the word line 536 and the vertical sidewall of the bit line 530. As is illustrated, the memory element includes a portion of the memory material that runs the entire length of the vertical sidewall of the word line 536.

In FIG. 10*b*, however, the portion of the memory layer that is adjacent to both the word line 536 and the bit line 530 is much smaller. The conformal memory layer within the recess includes a vertical portion 562 adjacent to the word line 536 and two horizontal portions 560. The vertical portion runs the length of the vertical sidewall. The upper horizontal portion 560 extends horizontally along a lower surface of the overlying insulating line 534. The lower horizontal portion 560 extends horizontally along an upper surface of the underlying insulating line 534. The portion of the memory layer that forms the memory effect for the memory cell is shown within box 640. This portion of the memory layer includes part of the vertical portion 562 that is adjacent to both the word line 536 and bit line protrusion 533. The horizontal protrusion 533 of the bit line includes a vertical sidewall that faces the vertical sidewall of the word line 536. The length of the vertical sidewall of the horizontal protrusion 533 in the z-direction is substantially less than the length of the vertical sidewall of the word line 536 in the z-direction. Accordingly, the portion of the memory layer that will exhibit a memory effect through control of the word line 536 voltage and bit line 530 voltage is much smaller. The length of the portion of the memory material in the z-direction forming the memory element corresponds to the length of the horizontal protrusion of the bit line. By restricting the cell area to the recess resulting from recessing the word line 536 between neighboring insulating lines 534, the memory element is reduced in size. This may permit control of the memory element for programming and reading, etc. using smaller voltages when compared with the memory element shown in FIG. 10*a*.

It is noted that variations to the structure shown in FIG. 10*b* are possible. In one embodiment, the memory layer 532 may be formed completely within the word line recesses. For example, the memory layer may be formed within the word line recesses and be removed from the vertical faces of the word line stack. In another example, the memory layer may be formed within the word line recesses and also along the vertical surfaces of the of word line stack.

Figure 11:
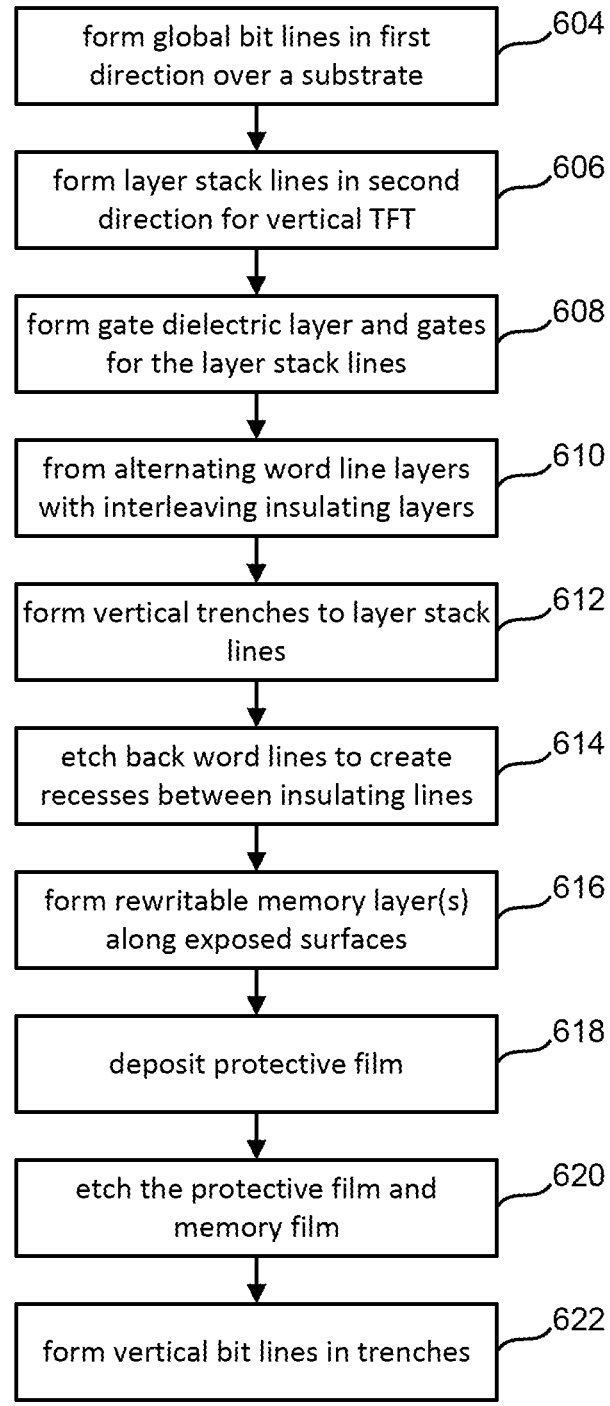
FIG. 11 is a flowchart describing a method of fabricating a three-dimensional memory structure having recessed word lines and recessed memory cell areas according to one embodiment of the disclosure.

FIG. 11 is a flow chart describing a process of fabricating a three-dimensional memory array in accordance with one embodiment. The process in FIG. 11 can be performed after manufacturing metal layers and substrate layers (e.g., drivers and other logic). For example, the process of FIG. 11 can follow zero ML-0 and first ML-1 metal layer manufacturing processes. In one example, the process may be preceded by forming a base oxide (e.g., 600 nm). FIGS. 12*a*-12*j* are perspective and cross-sectional views of a memory structure that can be fabricated according to the process of FIG. 11.

At step 604, global bit lines are formed that are elongated in a column direction over the previously formed layers and the substrate. At step 606, layer stack lines for a pillar select layer are formed over the global bit lines. The substrate layers and one or more metal layers can be manufactured, followed by forming the select gate layer stack lines for the pillar select structure. The metal layers can include a metal layer (e.g., metal layer ML-2) that is patterned and formed into the global bit lines.

Figure 12A:
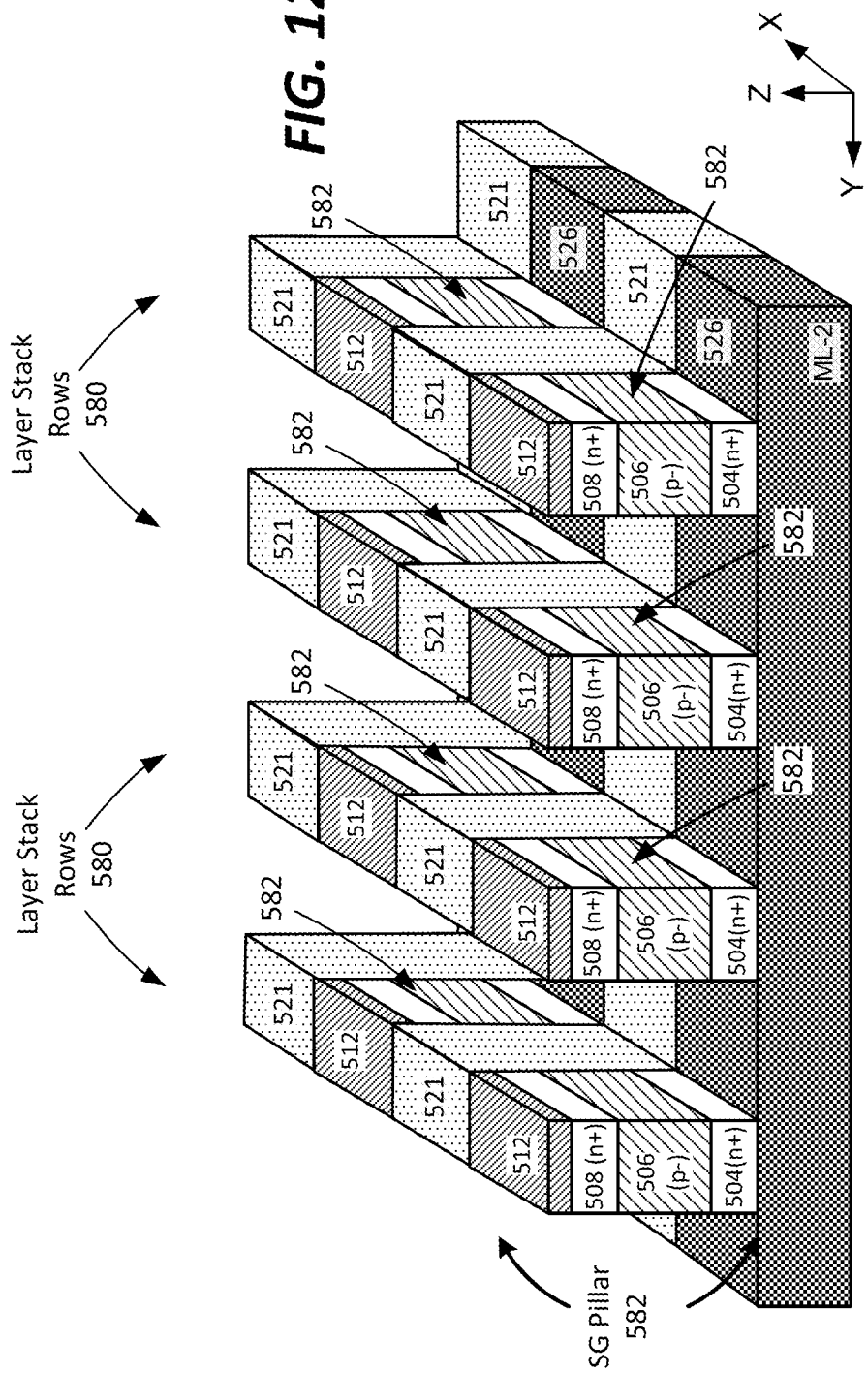

FIG. 12*a* is a perspective view depicting the results of step 604 and 606 in one embodiment. Four layer stack lines 580 (also called layer stack rows), each containing two select gate (SG) or select device pillars 582 are shown. It is noted that a typical memory will include many more pillar select lines and within each pillar select line, many more select device pillars. The layer stack lines are elongated in the row or x-direction, orthogonal to the global bit lines which extend in the column or y-direction. The global bit lines may include one or more metal layers such as a layer of tungsten (W) (e.g., 150 nm) between two layers of titanium nitride (TiN) (e.g., 20-100 nm) in one example. Additional layers such as an n+ polysilicon layer may be included in the bit lines, overlying the metal ML-2 material. The global bit lines are separated by an insulating layer 521 formed from an oxide or other dielectric material. Each pillar is separated from adjacent pillars in the same line by insulating material 521. In another example, the insulating material between bit lines and the insulating material between select gate pillars may be different.

Each select gate pillar includes a lower n+ region (e.g., 30 nm) forming the lower S/D region 504 for the select device, a p− region (e.g., 120 nm) forming the body 506, and an upper n+ region (e.g., 50 nm) forming the upper S/D region 508. Note that the upper S/D region is a drain in one example and the lower S/D region is a source. In other example, the upper S/D region is a source and the lower S/D region is a drain. As described above, different configurations and materials may be used to form the body and S/D regions. In FIG. 12*a*, the pillars include a conductive hard mask region 512 that can be used to form a contact to the overlying vertical metal bit line, for example. These regions may extend as lines in the row direction over multiple pillars in other examples. The conductive hard mask may include metals or doped polysilicon, for example. In one example, the hard mask material is a metal such as tungsten and/or TiN that serves as a mask and also enables contact to the metal bit lines. Furthermore, the metal hard mask may provide a suitable etch stop for forming trenches in which the metal bit lines are formed. These regions are optional and are not included in other embodiments. When included, these regions may be considered part of the vertical TFT select device.

Figure 12B:
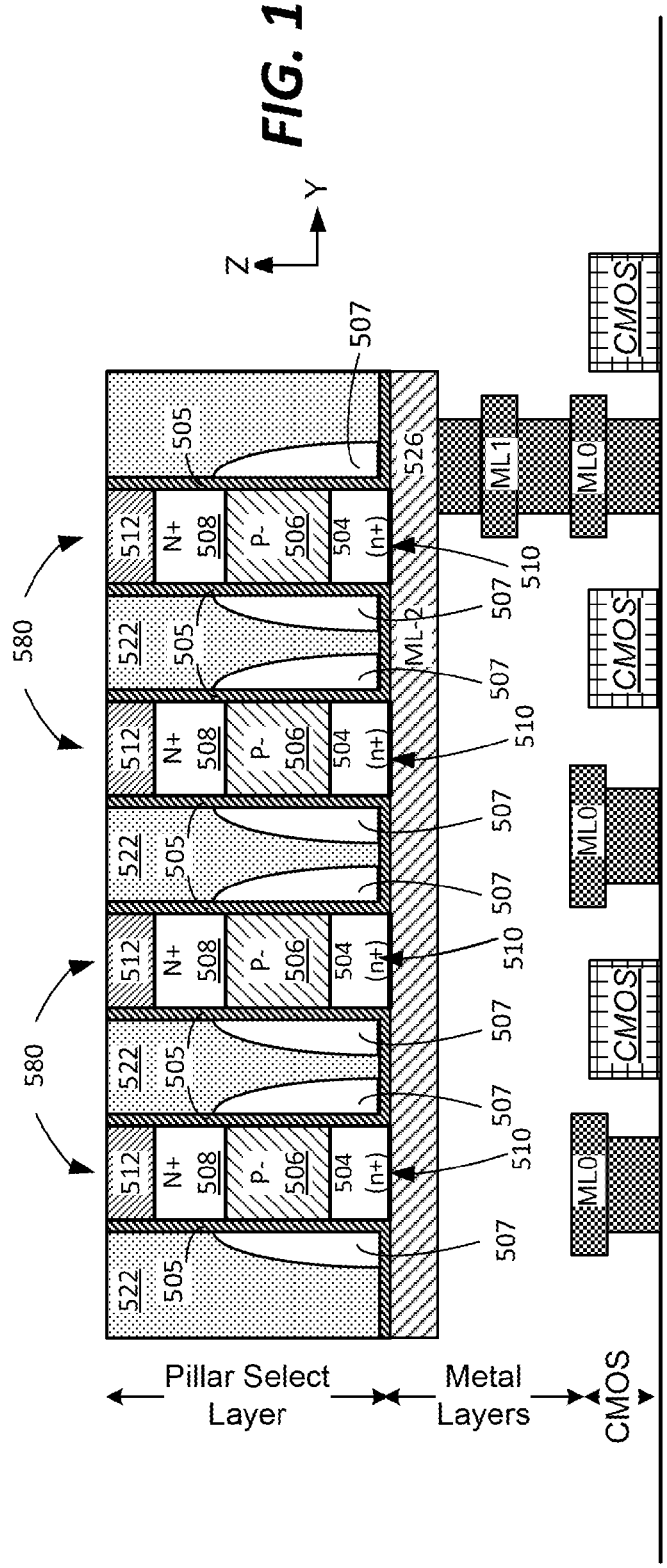

At step 608, a gate dielectric layer and gates for the select devices are formed. FIG. 12*b* is a cross-sectional view along a line in the y-direction through a column of select devices depicting the results of step 608 in one embodiment. The gate dielectric layer 505 layer extends along the vertical sidewalls (elongated in the x-direction) of each select device pillar. In one example, gate dielectric layer 505 is an oxide such as silicon oxide or hafnium oxide formed by atomic layer deposition (ALD). In another example, gate dielectric layer 505 is a thermally grown oxide. Conformal deposition can be used to form a dielectric layer between approximately 3 and 10 nanometers in thickness in one example. In FIG. 12*b*, the gate dielectric extends over the global bit line between adjacent select gate pillars. For example, the gate dielectric 505 is an SiO2 gate oxide formed using atomic layer deposition to a thickness of about 5 nm in one example. Such a gate oxide can provide adequate isolation between the gates and global bit lines in one embodiment In other examples, an optional base dielectric region 520 may be formed as shown in FIG. 9 or a continuous gap fill dielectric may be used as shown in FIG. 8. A base dielectric region can be formed after the gate dielectric or before the gate dielectric to provide further isolation between the gates 507 and the global bit lines 526. Additionally, bases 520 can be formed to aid in defining a lower endpoint of the gates.

A gate layer is formed and etched back to form gates that extend vertically along the vertical sidewalls of the layer stack lines. Etching back the gate material removes horizontal portions of the gate material to leave sidewall spacers. Each sidewall spacer forms one gate 507. The gates 507 are separated from the pillar stack lines by the gate dielectric 505. In this example, gates 507 may be referred to as spacer gates 507 due to their formation by conformal deposition and etch back as associated with spacer-formation processes. Any suitable etch back process may be used. In the x-direction, the gates extend along each layer stack row to form gates for each select device formed in the line. In the vertical or z-direction, the upper surface of the gates may extend beyond the upper S/D junction between the p− body region and the upper n+ S/D region. The gates extend vertically toward the substrate, having a lower surface that extends beyond the lower S/D junction between the p− body region and the lower n+ S/D region. The gate bottom height refers to the vertical distance between the lower surface of the gate and the upper surface of the global bit line. The gate bottom height is controlled by the ALD process for the gate dielectric deposition in one example. This can provide precise control to position the bottom of the gate relative to the lower junction. In one example, the gate is formed by depositing 60 nm of TiN, and etching back 135 nm to leave the spacers. Polysilicon or other materials may also be used.

FIG. 12*b* also depicts the formation of a gap fill dielectric 522. A gap fill dielectric 522 is formed, planarized, and then etched back to expose the upper surface of each layer stack line. Chemical mechanical polishing (CMP) may be used for the planarization. If CMP is used, a separate etch back may not be used in one embodiment. In FIG. 12*b*, etching back exposes the upper surface of the hard mask regions 512. In one example, the gap fill dielectric is a high density plasma (HDP) oxide, deposited to a thickness of 300 nm, planarized by CMP, then etched back 150 nm to expose the upper surface of the hard mask regions. In another example, the etch back may expose the upper surface of S/D regions 508. The gap fill dielectric 522 fills the spaces between adjacent layer stack lines. The gap fill dielectric 522 is an oxide formed using a flowable CVD gap fill technology scheme in one example. Polysilazane-based spin-on-glass techniques may also be used.

Any number of techniques may be used to form the select gate pillars, gates, and gate dielectric. FIGS. 12*a*-12*j* depict a gate-last approach where layer stack columns for the select devices are patterned and etched (not shown) first, overlying and parallel to the global bit lines. After a gap fill, the layer stack rows 580 are patterned and etched, forming the select device pillars. After defining the rows, the gate dielectric and gate layers are formed elongated in the row direction, providing horizontal separation between the gates and bodies. Optionally, dielectric bases may be formed, before or after forming the gate dielectric. In another approach a gate-first process can be used to form layer stack rows that are first patterned and etched, orthogonally over the underlying set of global bit lines that are elongated in the column direction. The gate dielectric and gates are then formed, followed by patterning and etching layer stack columns, forming pillars of the select device layers. Each pillar includes a body, an upper source/drain region, and a lower source/drain region. Additional regions such as contact and insulating regions may be formed over the upper source/drain region. Additional regions such as an electrode may be formed under the lower source/drain region.

Figure 12C:
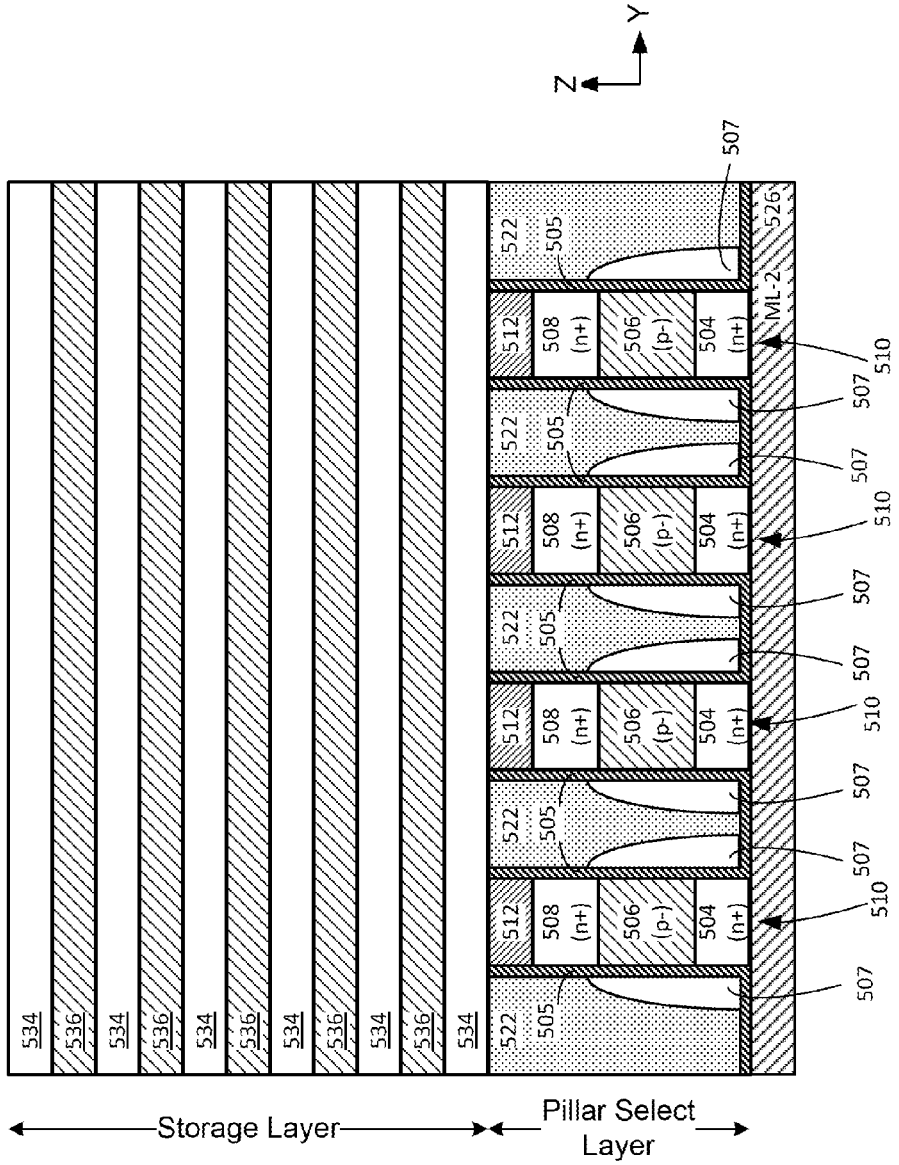

At step 610, alternating word line and insulating layers are formed over the layer stack lines as part of the memory layer. FIG. 12*c* depicts the results of step 610 in one embodiment. The metal layers and CMOS layer depictions have been removed from FIG. 12*c* for conciseness and clarity of presentation. In FIG. 12*c*, the memory layer is formed after etching back or polishing the oxide fill material 522. The memory layer includes alternating oxide layers 534 and word line layers 536 in this example. The word lines are interleaved between two oxide insulating layers. In one embodiment, the word lines are made from TiN. In one example, the TiN has a vertical thickness of 10 nm and the oxide has a vertical thickness of 7 nm but other dimensions may be used.

At step 612, trenches or channels are etched in the memory layer. One or more hard mask layers can be patterned to form lines in the x-direction that cover the memory layer at positions between the layer stack lines. Using the hard mask, the memory layer can be etched to form a trench having a bottom that exposes the upper surface of each layer stack line. FIG. 12d depicts the results of step 612 in one embodiment. Note that much of the labeling of the pillar select layer is removed for clarity of presentation. Trenches 529 are etched in the memory layer, through the word line and insulating layers to expose the upper surface of the layer stack lines. The trenches have two vertical sidewalls formed by the vertical sidewalls of the word lines and the insulating lines. The trenches are shown with vertical sidewalls that extend in a perfectly orthogonal direction vertical to the global bit lines. In many cases, the trench etching process will result in vertical sidewalls that intersect the upper surface of the vertical TFT select devices at a more than ninety degree angle. The trenches may be larger at the top and narrower at the bottom closer to the select device, forming a taper as the trench proceeds vertically down toward the pillar select layer.

At step 614, the word lines are etched back to form recesses between the insulating lines. Various processes may be used to etch back the word lines. In one embodiment, a wet-etch process is used to etch back TiN word lines selective to the oxide. The etch chemistry will remove a portion of the word line material while leaving all or most of the insulating line material.

Figure 12E:
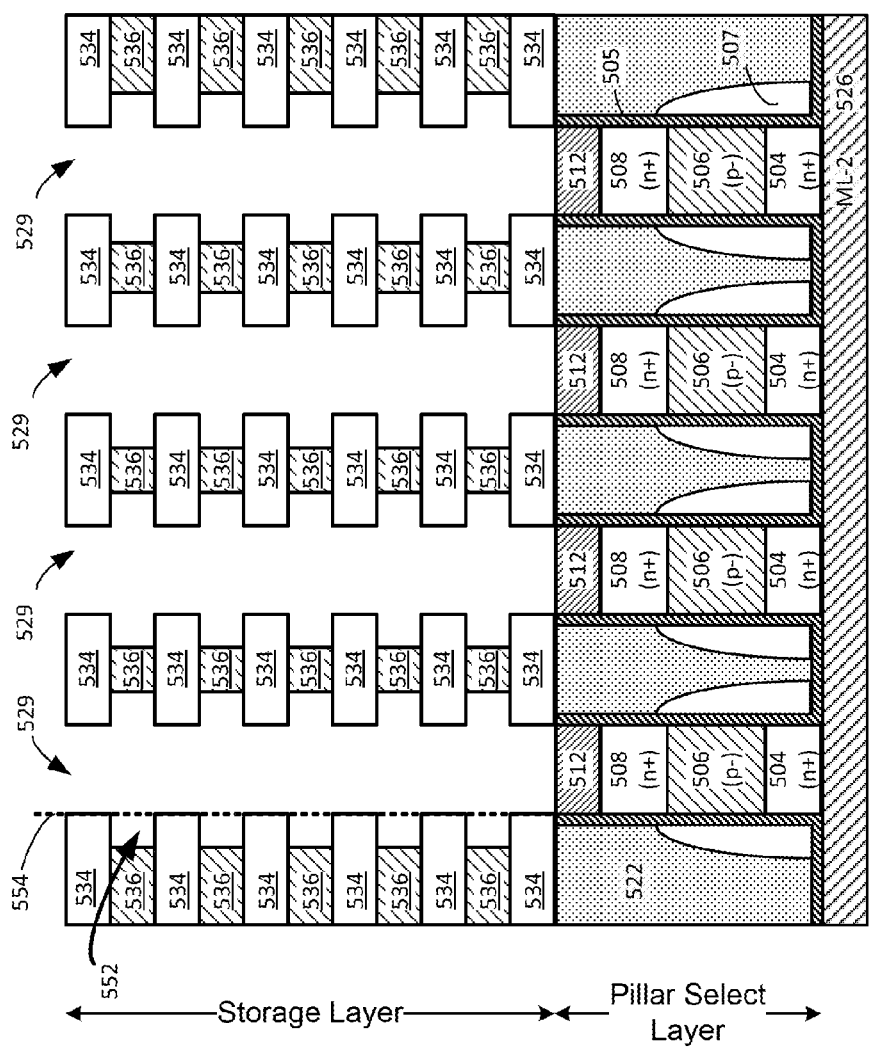

FIG. 12e depicts the results of step 614 in one example. The word lines are recessed relative to the insulating lines, creating recesses 552 or voids between adjacent insulating lines. The amount of recess may vary by embodiment. In one example, the word lines are etched back about 50 nm relative to the insulating lines. However, larger or smaller etch backs may be used. Each word line and insulating line includes a vertical sidewall facing a corresponding trench. After being recessed, the vertical sidewalls of the word lines are not aligned with the vertical plane 554 defined by the sidewalls of the trench 529. The trench sidewall is defined by the vertical sidewalls of the insulating lines 534 adjacent to the trench. In this manner, the vertical sidewalls of the word lines 536 are recessed laterally in the horizontal y-direction relative to vertical sidewalls of the insulating lines. Thus, the vertical sidewalls of the word lines are positioned beneath a lower surface of the adjacent overlying insulating line and above an upper surface of the adjacent underlying insulating line. The vertical sidewall of each word line is positioned at a horizontal distance in the y-direction from the vertical plane. This further results in word lines having a horizontal dimension in the y-direction that is less than a horizontal dimension in the y-direction of the insulating lines.

At step 616, one or more rewritable memory layers are deposited over the memory structure. A conformal deposition process can be used to form the memory material along the exposed surfaces of the trench, including the vertical sidewalls of the horizontally recessed word lines. A resistance change material such as HfO2 can be formed in one example, although any of the earlier-described materials may be used. Rewritable material 532 is conformally deposited to cover exposed surfaces including the vertical sidewalls of word lines 536 and the vertical sidewalls of insulating lines 534.

Figure 12F:
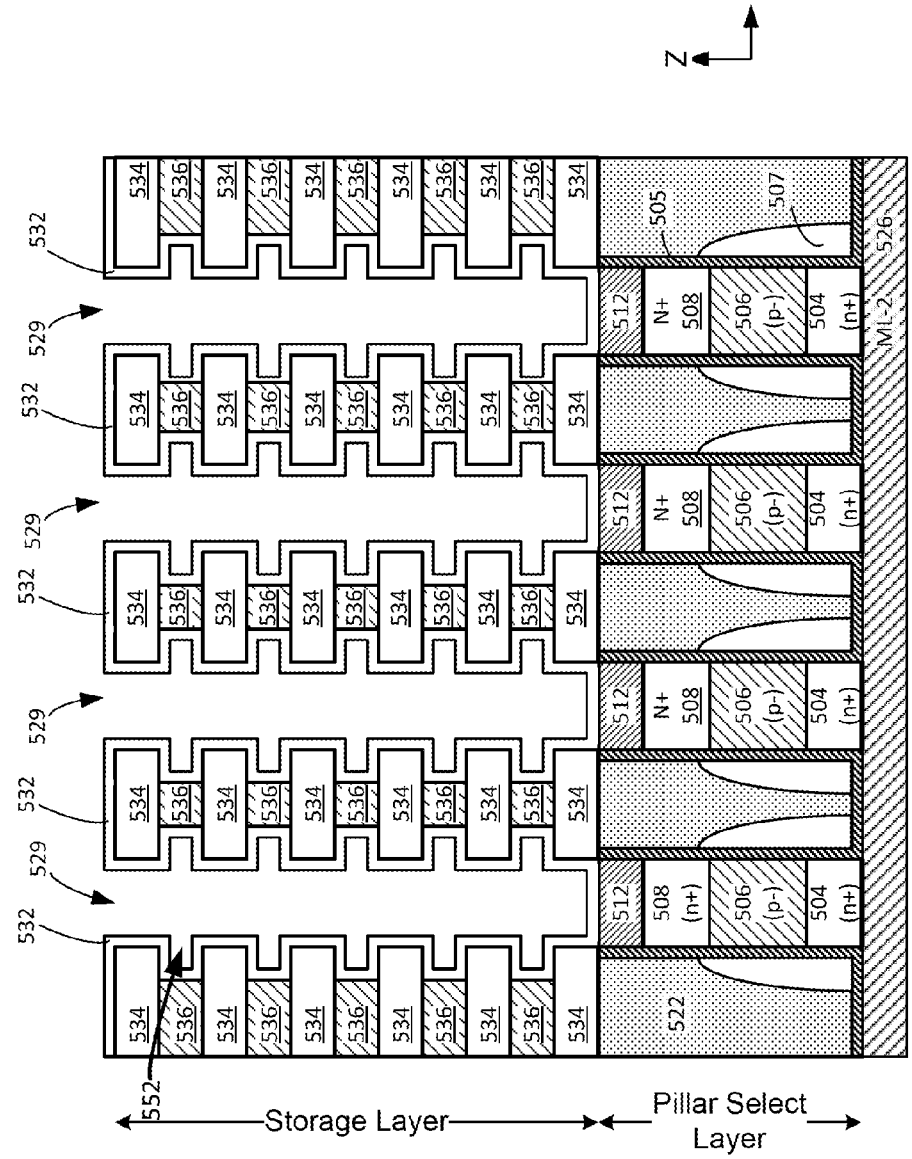

FIG. 12f depicts the results of step 616 in one embodiment. One or more resistance change material layer(s) 532 are formed conformally along the exposed surfaces of the memory structure. The memory layer 532 coats the exposed surfaces of the insulating lines and word lines. Memory layer 532 extends vertically along the vertical sidewalls of the insulating lines within the trenches. Memory layer 532 also extends vertically along the vertical sidewalls of the word lines within recesses 552. Additionally, the memory layer 532 extends horizontally along the exposed upper surfaces and lower surfaces of the insulating lines within the word line recesses. The memory layer does not completely fill the word line recesses 552. Accordingly, the recesses 552 are reduced in size, both horizontally and vertically, but the recess remains between the adjacent insulating lines.

Figure 12G:
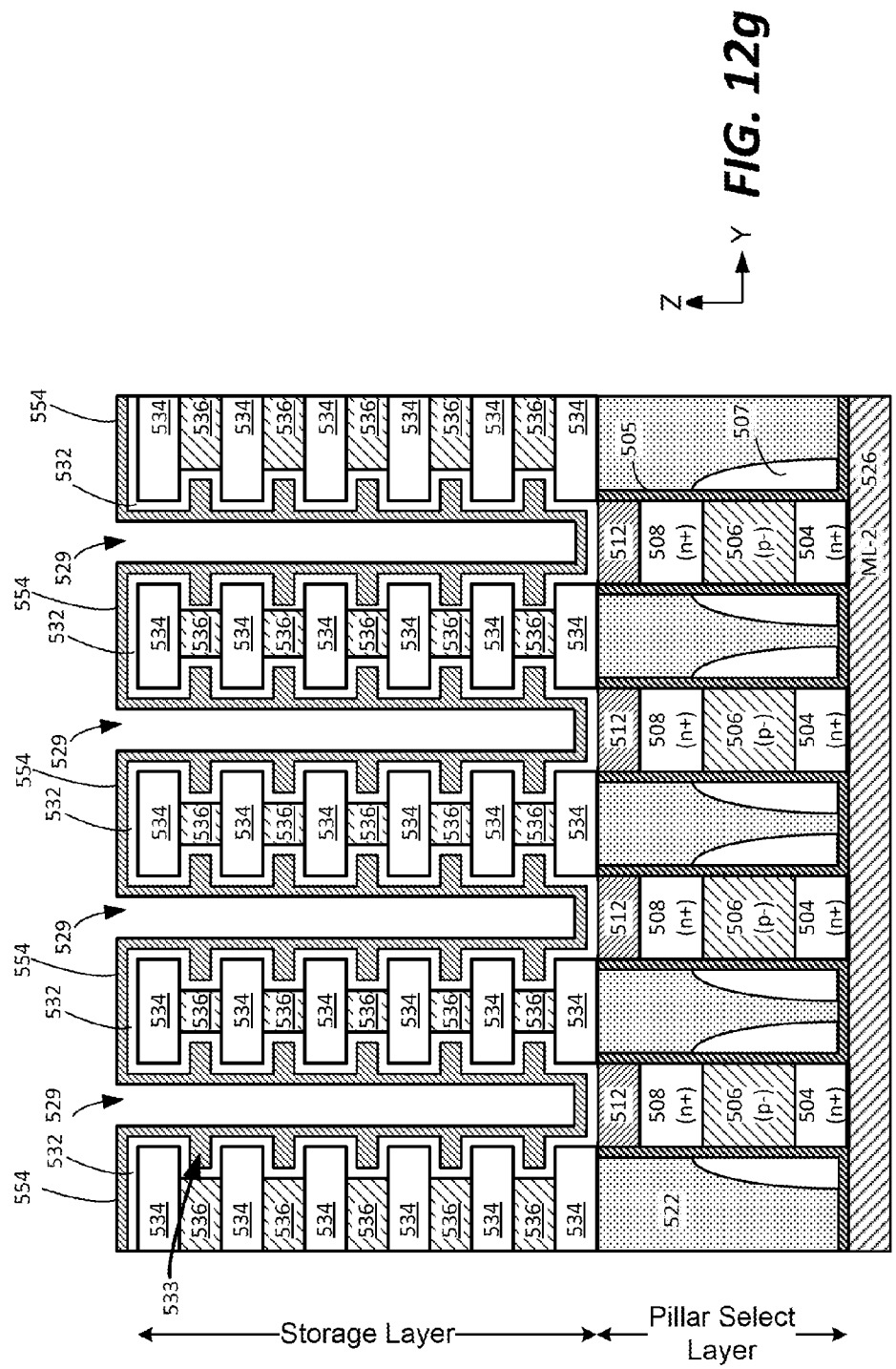

At step 618, a protective film is deposited over the memory structure. The protective film covers the exposed surfaces of the memory layer to protect the memory layer from damage during subsequent processing steps. FIG. 12g depicts the results of step 616 in one embodiment. A thin protective film 554 is formed along the exposed surfaces of the memory structure. Various materials can be used for protective film 554. The thin protective film forms part of the vertical bit line film stack in one embodiment. Accordingly, film 554 may include a conductive material such as n+ polysilicon or a metal such as TiN. The polysilicon or metal may be deposited using a conformal deposition process such as ALD in one embodiment. The protective film may also be formed from a sacrificial material, such as a carbon formed by chemical vapor deposition (CVD).

As described and shown in FIG. 12g, the protective film 554 may form part of the vertical bit line structure. The protective film includes horizontal protrusions 533 that extend laterally outward relative to a centerline of each trench at different distances in the z-direction. Each horizontal protrusion extends horizontally at a position of the plane corresponding to each word line layer. The protrusions extend into the remaining portions of the recesses formed between vertically adjacent insulating lines. Each protrusion extends horizontally adjacent to a corresponding word line, with the layer of memory material sandwiched therebetween. The protective film completely fills the recesses in this example, but in other examples the protective film may only partially fill the recesses. Thus, the protective film is formed beneath the lower surface of an insulating line formed above the corresponding word line, and above the upper surface of an insulating line formed below the corresponding word line. Each horizontal protrusion includes a vertical sidewall that faces the vertical sidewall of the corresponding word line in the y-direction. A single horizontal protrusion 533 is labeled in FIG. 12g to avoid obfuscating the depiction of the memory structure. As is illustrated, a horizontal protrusion extends horizontally adjacent to each of the word lines 536. In FIG. 12g, the film is also formed along the vertical sidewalls of the insulating lines, although this is not required.

At step 620, the protective film and memory material are etched back to expose an upper contact to the underlying vertical TFT select device. A dry isotropic etch is used in one example to etch the horizontal surfaces of the protective film and memory layer. The dry isotropic etch can remove the horizontal exposures selectively to the vertical surfaces. FIG. 12h depicts the results of step 620 in one embodiment. The protective film and memory material are etched back from the horizontal surfaces of the memory structure, at the lower end of each trench. The etch back stops on the upper surface of the conductive hard mask regions 512. In other examples, etching back may expose an upper surface of the upper S/D region 508. In either case, the etch back exposes a contact area 556 at the bottom of each trench for subsequent contact to the vertical TFT select devices 510.

As earlier described, the memory elements are formed within recesses 552 at a distance horizontally from the vertical sidewalls of the insulating lines. In this manner, the portions of the memory material within the recesses can be protected by a relatively thin protective liner 554. The recess enables the portion of the memory layer serving as the memory element to be spatially separated at a distance from the exposed vertical surfaces of the protective film during etching. Because a thinner liner is used, a larger contact area in the y-direction to the upper surface of the underlying vertical TFT select device is provided. A wet cleaning process may be performed after etching back. The protective liner and spatial separation provided by the recesses from the exposes surfaces will protect the memory element during cleaning processes.

In one embodiment (not shown) the protective film may be formed and then etched back to expose the memory material along the vertical sidewalls of the insulating lines. The memory material can then be etched back to remove the memory material from the vertical sidewalls of the insulating lines. This additional removal of memory material is not needed where filament based resistance change materials such as HfO2 are used, but nevertheless may be performed when such materials are used or when other types of memory materials are used.

Figure 12I:
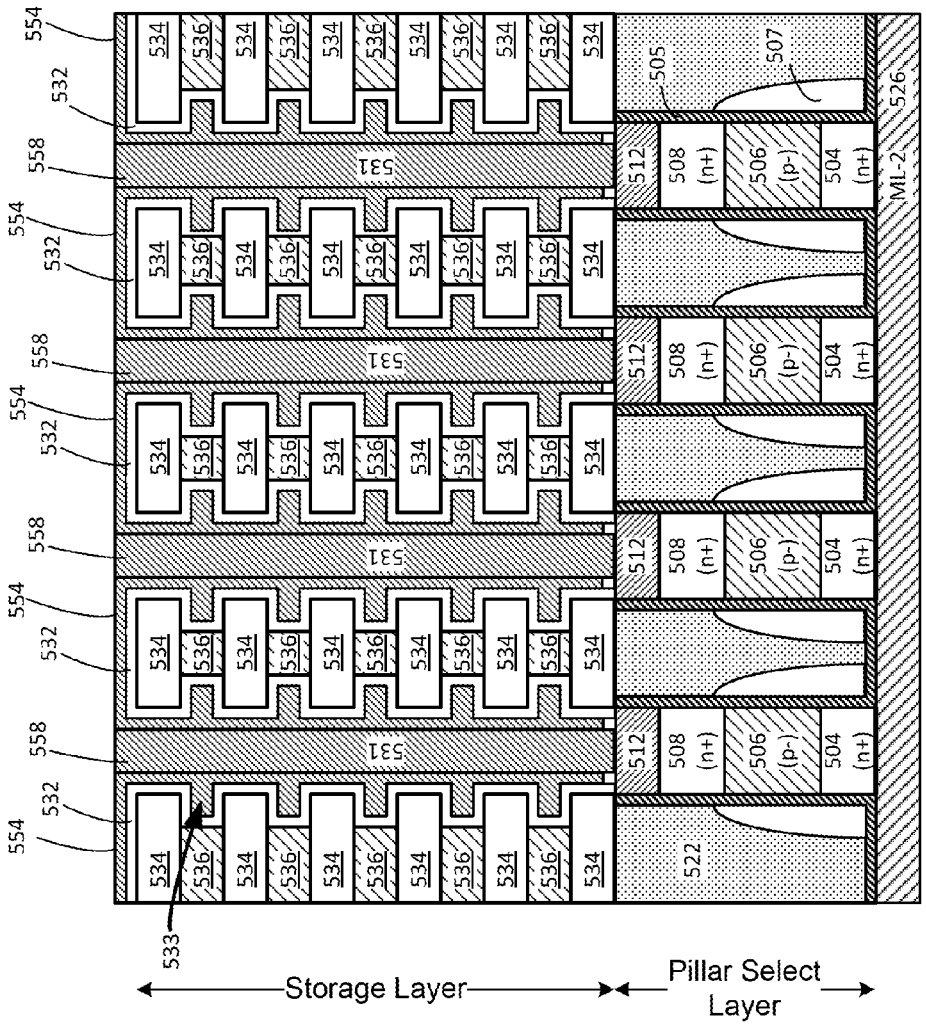

At step 622, the vertical bit lines are formed in the trenches. FIG. 12i depicts the results of step 622 in one embodiment. One or more conductive layers 558 are deposited and/or grown to fill the trenches. In one embodiment, the conductive layers include highly-doped N+ polysilicon. In another embodiment, the conductive layers include metals such as Tungsten and/or Titanium Nitride (TiN). Combinations of these material can also be used.

Figure 12J:
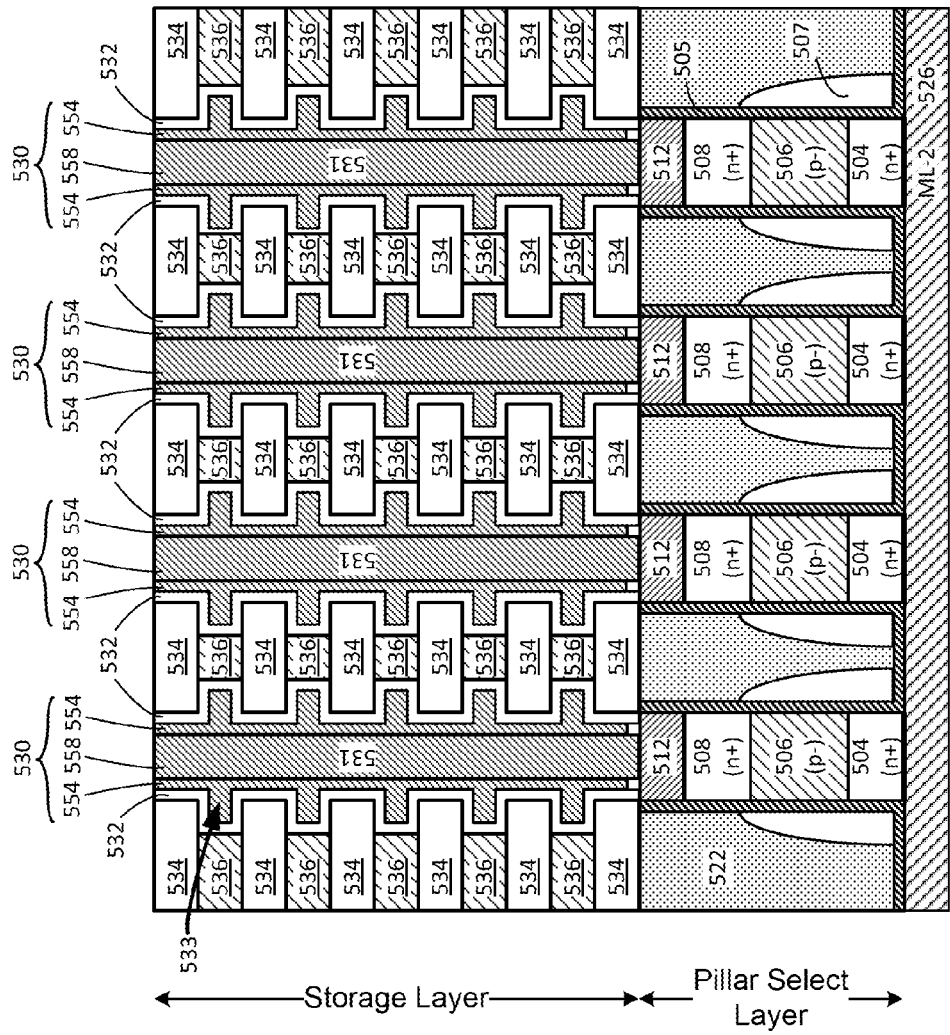

After forming the conductive layer, the protective liner 554 and conductive layer 558 can be etched back or polished (e.g., chemical mechanical polishing) to the upper surface of the horizontal portions of the memory material over the top insulating lines 534. The memory material may also be etched back to expose the upper surface of the top insulating lines 534. FIG. 12j depicts the result of an etch back or polishing step in one embodiment. The vertical bit lines include portions of the conductive layer 558 and the protective liner 554. As a result of etching back the word lines, the vertical bit lines 530 include a body 531 that extends vertically from the upper surface of the vertical TFT select device. Horizontal protrusions 533 extend laterally from the body toward a word line at the corresponding memory level plane. The protrusions terminate at vertical sidewalls which are formed between insulating lines. The protrusions extend under a lower surface of the overlying insulating line and above an upper surface of the underlying insulating line. The vertical sidewalls of the protrusions are positioned under or over a corresponding insulating line, at a distance positioned horizontally from the vertical sidewalls of the insulating lines.

It is possible that an overetch may occur when etching the word line layer stack to form trenches 529. An excessive overetch may reach to the gap fill material 522 when etching as shown in FIG. 12d. If the overetch is excessive enough, exposure of the gates 507 may occur. Accordingly, an etch stop layer is formed in one embodiment over the vertical select devices 510 and gap fill material 522 before forming the word line layer stack to protect from overetching in later process steps.

Figure 13A:
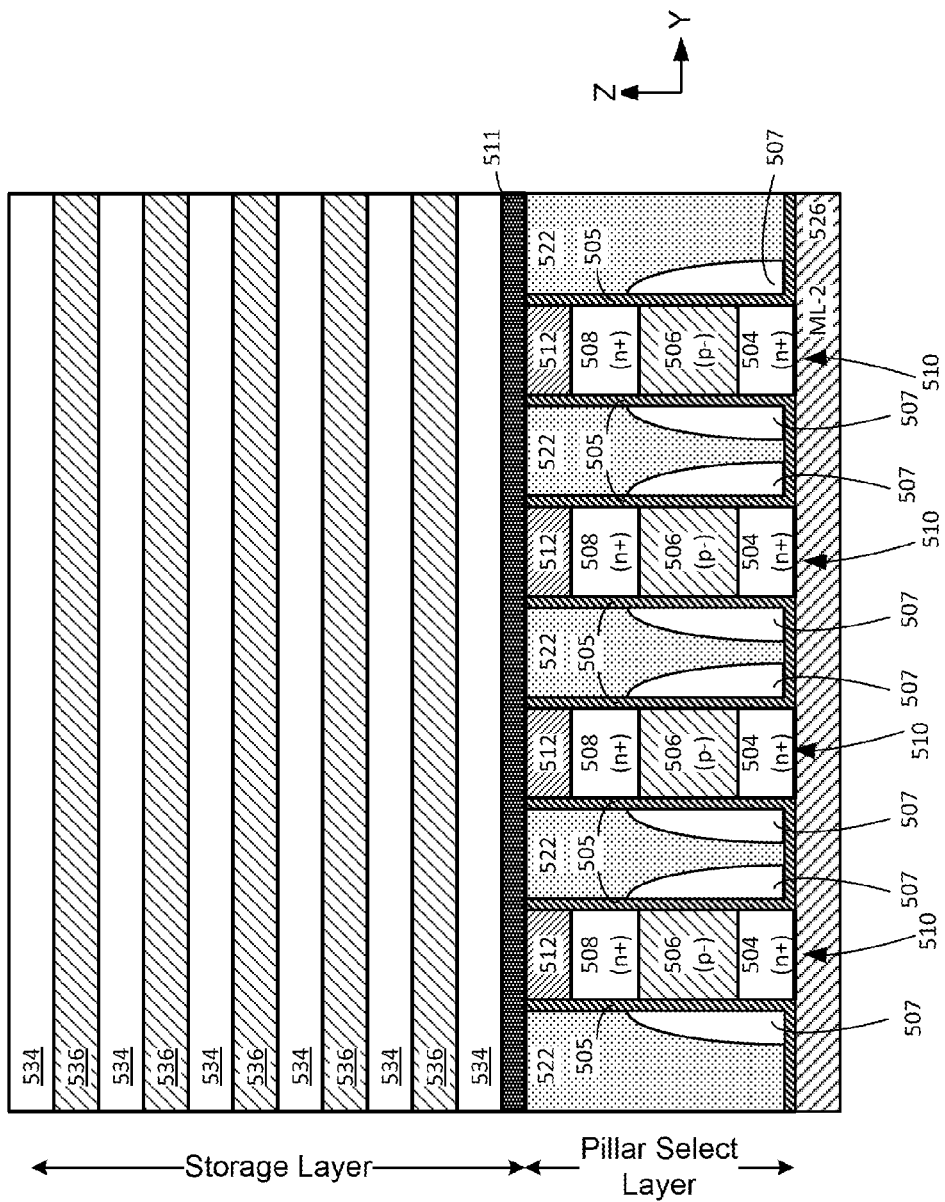
FIGS. 13a-13c are cross-sectional views depicting the fabrication of a three-dimensional memory structure using an etch stop layer in accordance with one embodiment of the disclosure.
Figure 13B:
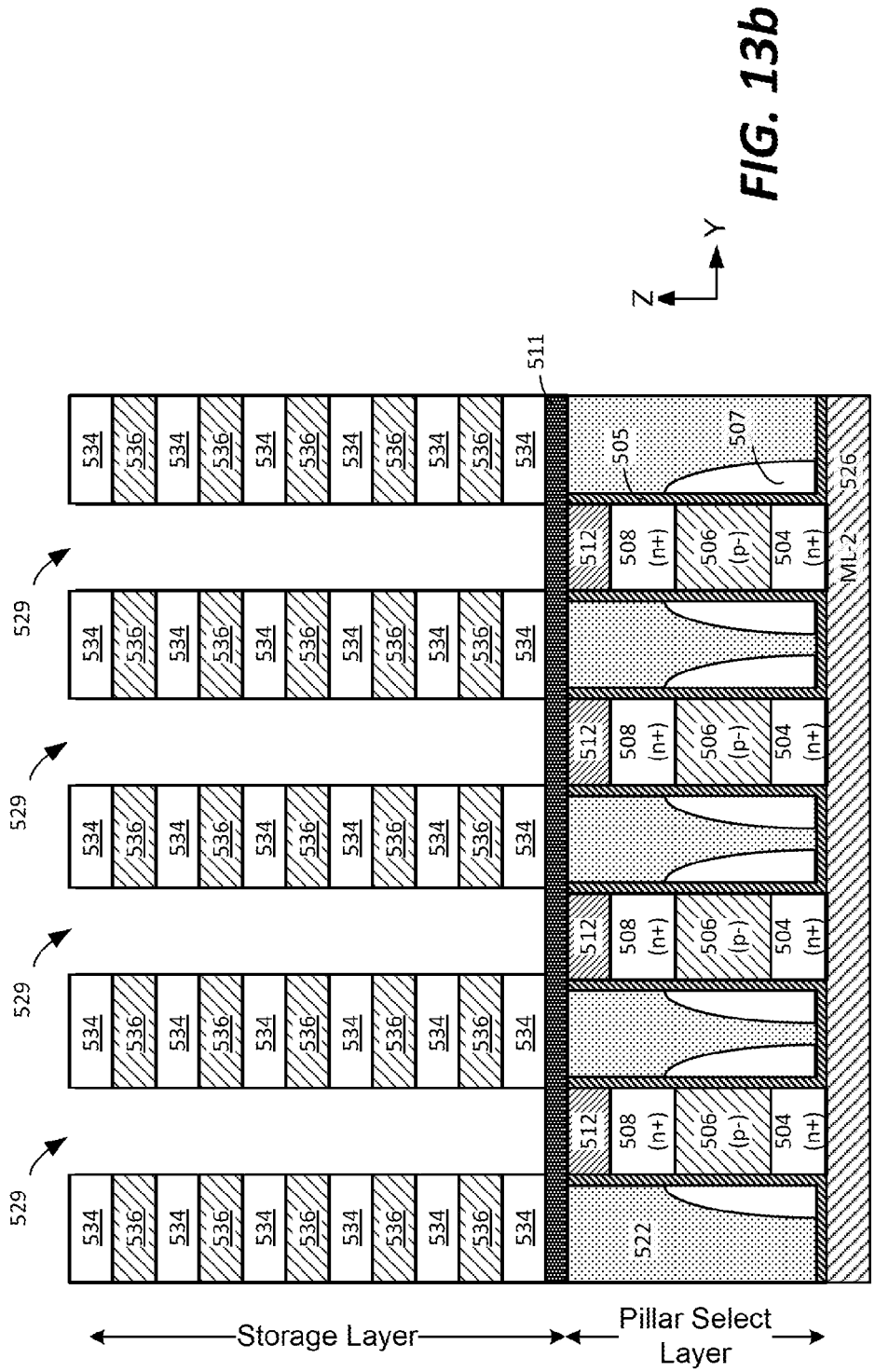
Figure 13C:
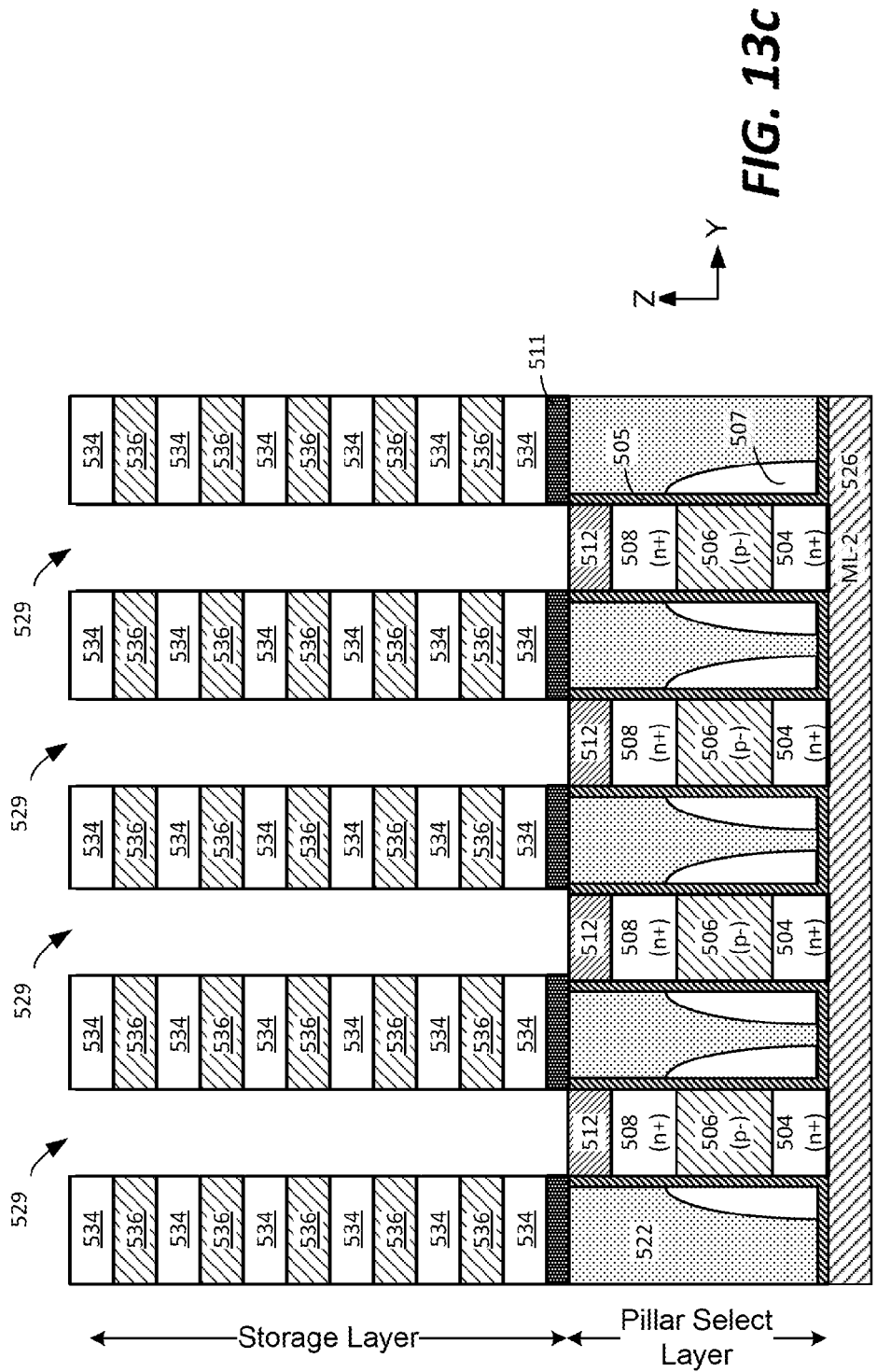

FIGS. 13a-13c depict the use of an etch stop layer 511 that overlies the select gate pillars and gap gill material 522 in one embodiment. The etch stop layer is an insulating material in one example, For example, insulating oxides, nitrides, or combinations of these or other materials may be used. The etch stop layer 511 may be formed immediately after forming the gap fill material 522 and polishing (e.g., CMP) to form the structure depicted in FIG. 12b. After forming the etch stop layer 511, the alternating insulating layers and word line layers can be formed After forming the word line layer stack, etching is performed as shown in FIG. 13b. Etching proceeds through the word line layer stack to form trenches 529. As earlier described, the sidewalls of trenches 529 may include a slope such that the lower portion of the trench is narrower than the upper portion. The etch chemistry is selective for the word line layer and the insulating layers 534 so that etching stops upon reaching the etch stop layer 511. After etching the layer stack, a second etch process is performed as shown in FIG. 13c. The etch chemistry is selective for the etch stop layer to remove the etch stop layer 511 from the bottom of each trench and expose the upper portion of the hard mask material 512. Processing then proceeds at step 614 of FIG. 11 to recess word lines 536 as shown in FIG. 12e.

Figure 14A:
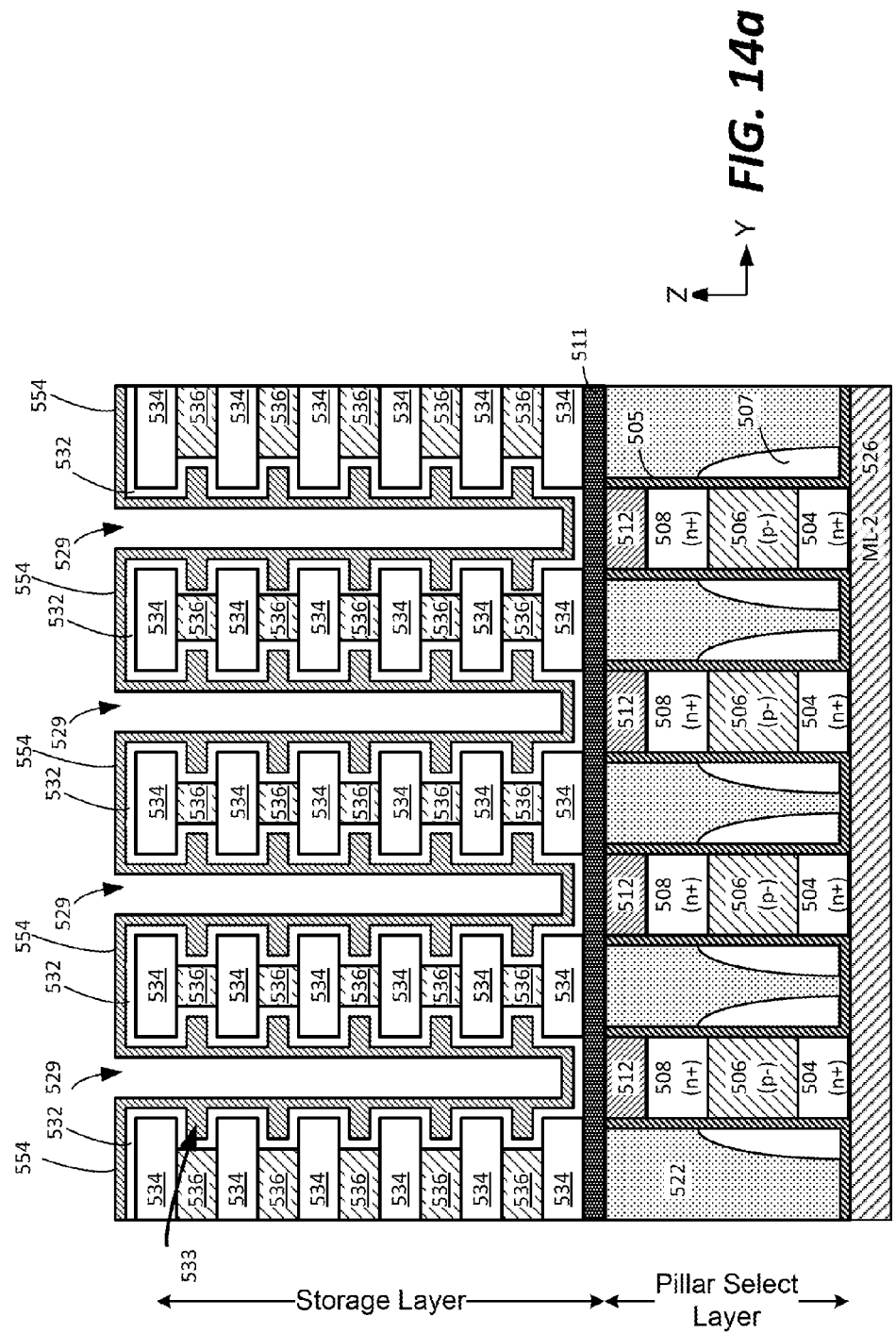
FIGS. 14a-14c are cross-sectional views depicting the fabrication of a three-dimensional memory structure using an etch stop layer in accordance with one embodiment of the disclosure.
Figure 14B:
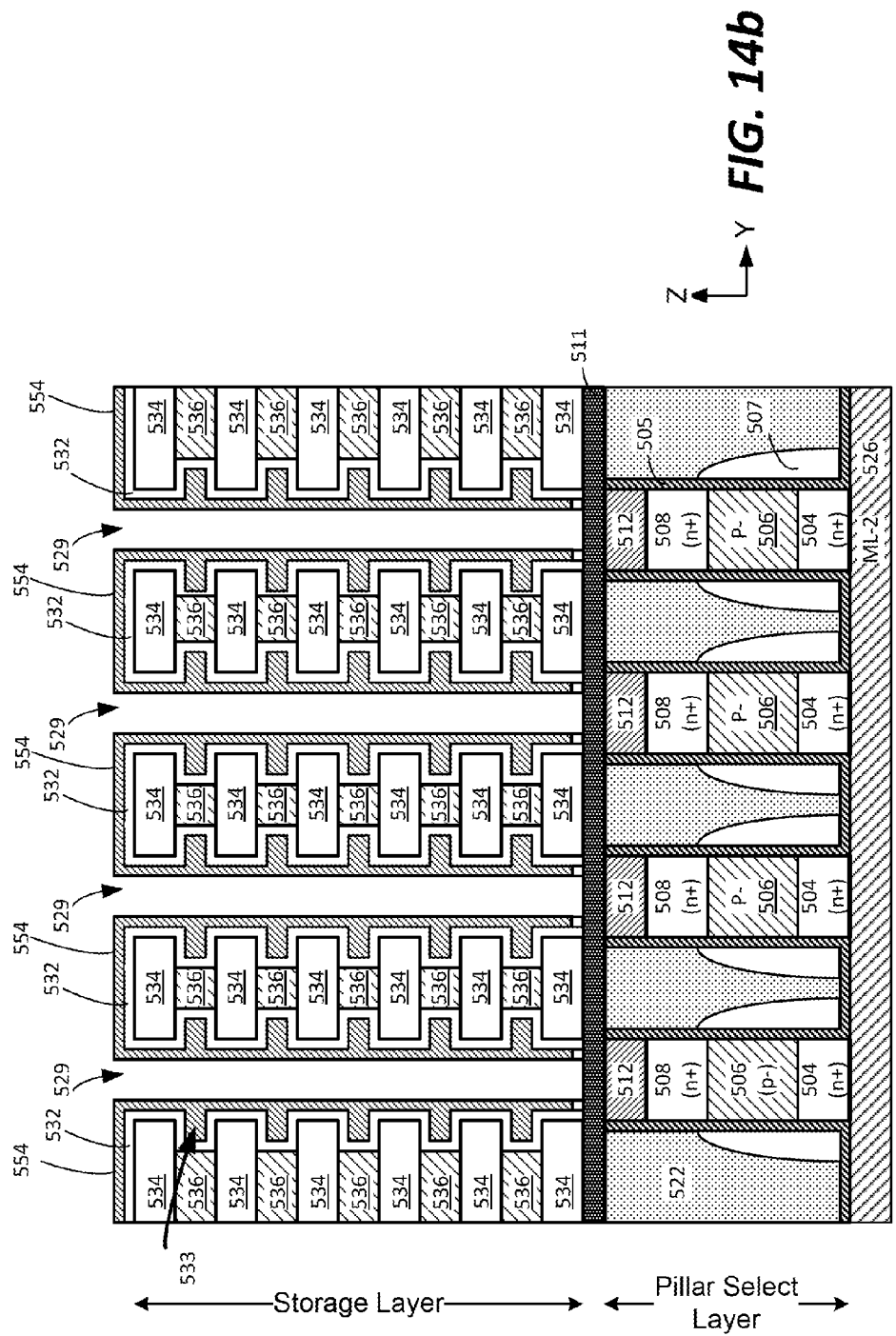
Figure 14C:
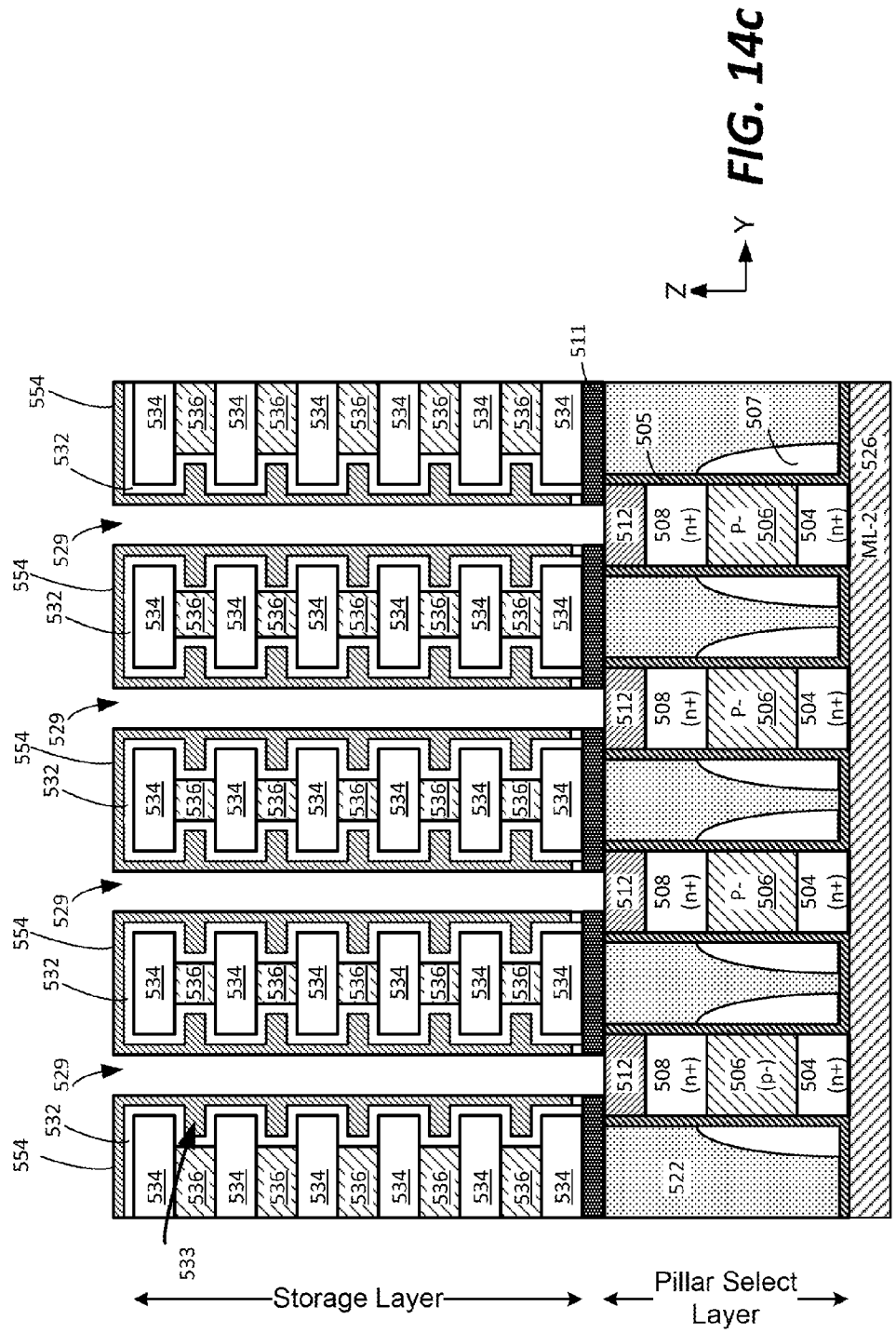

In another variation, the etch stop layer can be removed to expose the upper surface of the hard mask layer 512 at the top of each pillar after forming and etching back the memory layer 532 and protective film 554. As shown in FIG. 14a, the etch stop layer 511 may be formed below the alternating insulating layer 534 and word line layers 536 which are etched to form trenches 529. The etch stops on the etch stop layer 511. The memory layer 532 and protective film 554 are then formed. The horizontal portions of the memory layer 532 and protective film 554 are removed using one or more selective etch processes which stop on the etch stop layer 511. After exposing the etch stop layer, an etch process selective for the etch stop layer can be performed as shown in FIG. 14c. Etching removes the horizontal portion of the etch stop layer 511 above each select gate to expose the hard mask material 512.

Figure 15:
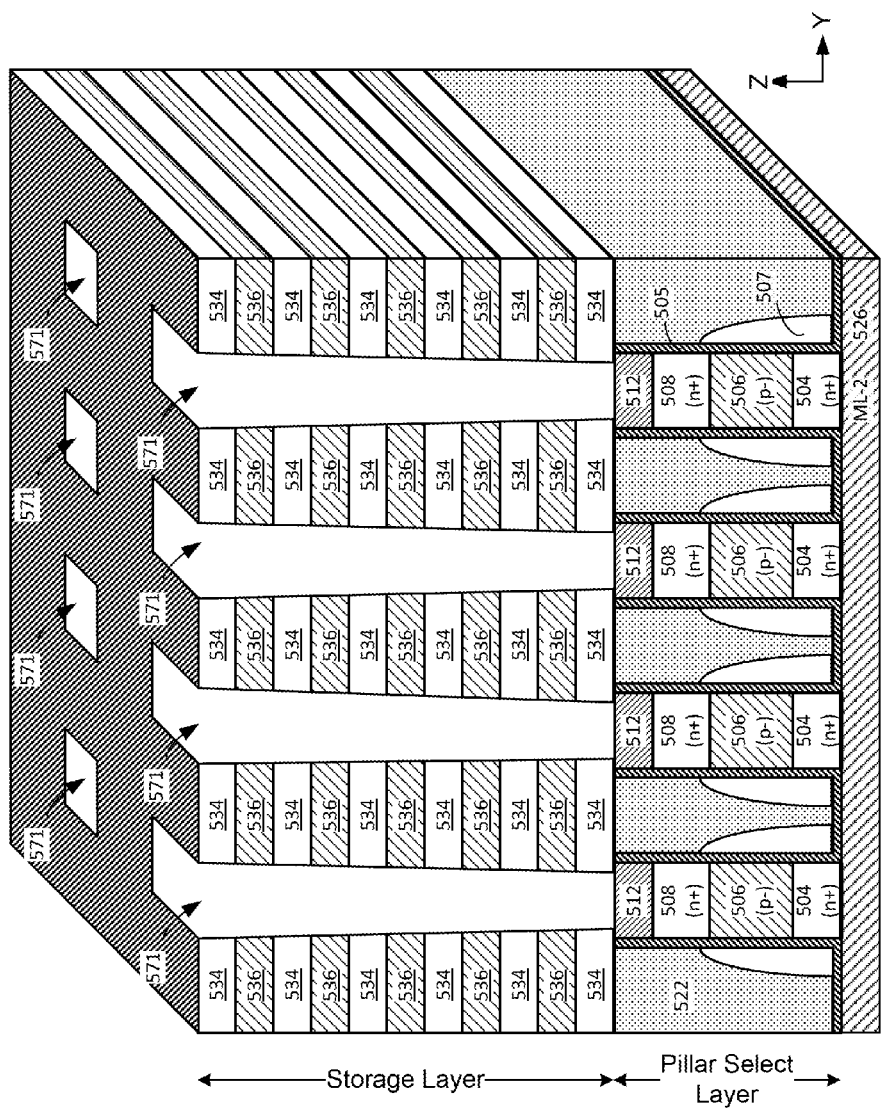
FIG. 15 is a perspective view depicting a three-dimensional memory structure including holes that are patterned for global bit line formation.

Another approach to avoid overetching is to pattern and etch holes for the vertical bit lines, rather than trenches 529 as earlier described. FIG. 15 is a perspective view showing a memory structure in accordance with one embodiment that includes holes 571 that are etched vertically into the word line layer stack to expose the upper surface of the hard mask material overlying each pillar. If the hole is aligned over the vertical select device top electrode (or hard mask 512), then the hole will be fully enclosed inside the footprint of the top electrode. This alignment can inhibit overetching into the gap fill material 522. If overlay errors are expected such that the holes may not be fully contained within the vertical select device footprint, an etch stop layer 511 over the select devices and gap fill material can be formed prior to forming the word line layers. The etch stop layer can inhibit overetching into the gap fill material 522.

Accordingly, there is described a three-dimensional (3D) non-volatile memory that includes a global bit line, a vertical thin film transistor (TFT) select device formed over the global bit line, a plurality of insulating lines formed over the global bit line, and a plurality of word lines formed over the global bit line. Each of the word lines includes a vertical sidewall that is recessed laterally relative to a vertical sidewall of each insulating line. The memory includes a memory layer that extends vertically along the vertical sidewall of each word line and horizontally from each word line over a portion of an upper surface of a corresponding insulating line that underlies the word line. The memory includes a vertical bit line coupled between the vertical TFT select device and the memory layer horizontally adjacent to each word line.

A three-dimensional (3D) non-volatile memory is described that includes a global bit line, a vertical thin film transistor (TFT) select device formed over the global bit line, and a first insulating line and a second insulating line extending in the first direction. The first insulating line and the second insulating line are separated vertically and each include a vertical sidewall. The memory includes a word line extending in the first direction between the first insulating line and the second line and having a vertical sidewall with a horizontal separation in the first direction from the vertical sidewalls of the first insulating line and the second insulating line. The memory includes a memory layer extending vertically along the vertical sidewall of the word line and at least partially underlying the second insulating line and overlying the first insulating line in the horizontal separation. The memory includes a vertical bit line coupled to the vertical TFT select device and the memory layer.

A three-dimensional (3D) non-volatile memory is described that includes a global bit line extending in a first direction over a substrate, a vertical TFT select device formed over the global bit line, a vertical bit line including a body that extends vertically over the vertical TFT select device and a horizontal protrusion extending from the body in the first direction, the horizontal protrusion including a vertical sidewall, a first insulating line extending in the first direction and underlying at least a portion of the horizontal protrusion, a second insulating line extending in the first direction and overlying the at least a portion of the horizontal protrusion, a word line extending in the first direction between the first insulating line and the second line and having a vertical sidewall, and a memory material formed at least partially between the vertical sidewall of the word line and the vertical sidewall of the horizontal protrusion.

A method of forming non-volatile storage is described that includes forming over a global bit line a vertical thin film transistor (TFT) select device, forming over the vertical TFT select device a plurality of word line layers and a plurality of insulating layers where each word line layer being separated from other word line layers by an interleaving insulating layer, etching the plurality of insulating layers and the plurality of word line layers to form a plurality of insulating lines and a plurality of word lines separated by a vertical trench over the vertical TFT select device, recessing the plurality of word lines to create a plurality of voids, forming from a memory layer a plurality of non-volatile storage elements in the plurality of voids, and forming a vertical bit line in the trench.

A method of forming non-volatile storage is described that includes forming over a vertical TFT select device a plurality of word line layers interleaved with a plurality of insulating layers, etching the plurality of insulating layers and the plurality of word line layers to form a vertical trench having a vertical sidewall, selectively etching back the plurality of word line layers relative to the plurality of insulating layers to form a plurality of recesses, depositing a memory material at least partially within the plurality of recesses and over the vertical TFT select device, depositing a protective liner over the memory material, etching back the protective liner and the memory material to expose a connection to the vertical TFT select device, and forming a vertical bit line in the trench.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile storage system, comprising:
   a global bit line;
   a vertical thin film transistor (TFT) select device formed over the global bit line;
   a plurality of insulating lines formed over the global bit line;
   a plurality of word lines formed over the global bit line, each word line having a vertical sidewall that is recessed laterally relative to a vertical sidewall of each insulating line;
   a memory layer extending vertically along the vertical sidewall of each word line, the memory layer extending horizontally from each word line over a portion of an upper surface of a corresponding insulating line that underlies the word line; and
   a vertical bit line coupled between the vertical TFT select device and the memory layer horizontally adjacent to each word line, the vertical bit line including a body and a plurality of horizontal protrusions that extend horizontally between the insulating lines.

2. The non-volatile storage device of claim 1, wherein:
   the memory layer is a continuous memory layer extending from a first word line to a second word line along a first insulating line.

3. The non-volatile storage device of claim 2, wherein:
   the corresponding insulating line is a first corresponding insulating line; and
   the memory layer extends horizontally from each word line under a portion of a lower surface of a second corresponding insulating line.

4. The non-volatile storage device of claim 3, wherein:
   the memory layer includes a first portion that extends horizontally from each word line over the portion of the upper surface of the first corresponding insulating line;
   the memory layer includes a second portion that extends horizontally from each word line under the portion of the lower surface of the second corresponding insulating line; and
   the first portion and the second portion of the memory layer at each word line are at least partially separated vertically by the vertical bit line.

5. The non-volatile storage device of claim 4, wherein:
   the vertical bit line includes a protective film contacting the memory layer and a second film, the protective film is formed between the first portion and the second portion of the memory layer at each word line.

6. The non-volatile storage device of claim 4, further comprising:
   a plurality of non-volatile storage elements formed from the memory layer, each non-volatile storage element including a third portion of the memory layer that contacts a vertical sidewall of a corresponding word line and a vertical sidewall of a corresponding horizontal protrusion of the vertical bit line extending between the first portion and the second portion of the memory layer at each word line.

7. A non-volatile storage system, comprising:
   a global bit line;
   a vertical thin film transistor (TFT) select device formed over the global bit line;
   a first insulating line and a second insulating line extending in the first direction, the first insulating line and the second insulating line being separated vertically and each including a vertical sidewall;
a word line extending in the first direction between the first insulating line and the second line and having a vertical sidewall with a horizontal separation in the first direction from the vertical sidewalls of the first insulating line and the second insulating line;
a memory layer extending vertically along the vertical sidewall of the word line, the memory layer at least partially underlying the second insulating line and overlying the first insulating line in the horizontal separation; and
a vertical bit line coupled to the vertical TFT select device and the memory layer, the vertical bit line extends horizontally over the first insulating line and below the second insulating line.

8. The non-volatile storage device of claim 7, wherein:
the vertical bit line is positioned laterally adjacent to a portion of the memory layer.

9. The non-volatile storage device of claim 7, wherein:
the vertical bit line extends laterally from a position above the vertical TFT select device with a first lateral endpoint above the first insulating line and below the second insulating line.

10. The non-volatile storage device of claim 7, wherein:
the vertical bit line extends laterally from a position above the vertical TFT select device and intersects a plane defined by the vertical sidewall of the first insulating line and the vertical sidewall of the second insulating line.

11. The non-volatile storage device of claim 7, wherein:
the vertical sidewall of the first insulating line is at a first horizontal position relative to a plane defined by a vertical sidewall of a body of the vertical TFT device;
the vertical sidewall of the word line is at a second horizontal position relative to the plane defined by the vertical sidewall of the body of the vertical TFT select device; and
the first position and the second position being separated by a horizontal distance relative to the plane.

12. The non-volatile storage device of claim 11, wherein:
the vertical sidewall of the second insulating line is at the first horizontal position.

13. A three-dimensional non-volatile storage system, comprising:
a global bit line extending in a first direction over a substrate;
a vertical TFT select device formed over the global bit line;
a vertical bit line including a body that extends vertically over the vertical TFT select device and a horizontal protrusion extending from the body in the first direction, the horizontal protrusion including a vertical sidewall;
a first insulating line extending in the first direction and underlying at least a portion of the horizontal protrusion;
a second insulating line extending in the first direction and overlying the at least a portion of the horizontal protrusion;
a word line extending in the first direction between the first insulating line and the second line, the word line having a vertical sidewall; and
a memory material formed at least partially between the vertical sidewall of the word line and the vertical sidewall of the horizontal protrusion.

14. The non-volatile storage system of claim 13, wherein:
the first insulating line is formed in a first plane a first vertical distance from the global bit line;
the word line is formed in a second plane a second vertical distance from the global bit line;
the second insulating line is formed in a third plane a third vertical distance from the global bit line; and
the second vertical distance is greater than the first vertical distance and less than the third vertical distance.

15. A method of fabricating non-volatile storage, comprising:
forming over a global bit line a vertical thin film transistor (TFT) select device;
forming over the vertical TFT select device a plurality of word line layers and a plurality of insulating layers, each word line layer being separated from other word line layers by an interleaving insulating layer;
etching the plurality of insulating layers and the plurality of word line layers to form a plurality of insulating lines and a plurality of word lines separated by a vertical opening over the vertical TFT select device;
recessing the plurality of word lines to create a plurality of recesses;
forming from a memory layer a plurality of non-volatile storage elements in the plurality of recesses; and
forming a vertical bit line in the vertical opening.

16. The method of claim 15, further comprising:
conformally depositing the memory layer along a vertical sidewall of each word line, along a lower surface of an insulating line overlying each recess, and along an upper surface of an insulating line underlying each recess.

17. The method of claim 16, wherein:
the memory layer in each recess includes a vertical portion and two horizontal portions, the two horizontal portions including a space there between after forming the memory layer; and
the vertical portion of the memory layer is spaced horizontally from a vertical sidewall of the insulating line overlying the recess and a vertical sidewall of the insulating line underlying the recess.

18. The method of claim 17, further comprising:
forming a protective film in the space between the horizontal portions of the memory layer in each recess, the protective film extending vertically along vertical portions of the memory layer formed along a vertical sidewall of each insulating line.

19. The method of claim 18, wherein:
the protective film includes a metal; and
the vertical bit line includes a metal.

20. The method of claim 18, wherein:
the protective film includes doped polysilicon; and
the vertical bit line includes doped polysilicon.

21. The method of claim 15, wherein the vertical opening is a trench.

22. A method of fabricating non-volatile storage, comprising:
forming over a vertical TFT select device a plurality of word line layers interleaved with a plurality of insulating layers;
etching the plurality of insulating layers and the plurality of word line layers to form a vertical trench having a vertical sidewall;
selectively etching back the plurality of word line layers relative to the plurality of insulating layers to form a plurality of recesses;

depositing a memory material at least partially within the plurality of recesses and over the vertical TFT select device;

depositing a protective liner over the memory material;

etching back the protective liner and the memory material to expose a connection to the vertical TFT select device; and forming a vertical bit line in the vertical trench.

23. The method of claim 22, wherein:

depositing the memory material includes conformally depositing the memory material along a vertical sidewall of each word line layer and a vertical sidewall of each insulating layer; and depositing the memory material includes conformally depositing the memory material along a portion of a lower surface of each insulating layer overlying a recess and along a portion of an upper surface of each insulating layer underlying a recess.

24. The method of claim 23, wherein:

depositing the protective liner includes forming the protective liner partially within each of the recesses.

25. The method of claim 24, wherein:

the memory material in each recess includes a vertical portion formed along a vertical sidewall of a corresponding word line layer and two horizontal portions formed along the lower surface of the insulating layer overlying the recess and the upper surface of the insulating layer underlying the recess; and the protective liner includes a horizontal protrusion extending into each recess between the two horizontal portions.

26. The method of claim 22, wherein:

the plurality of recesses are horizontal recesses extending over a portion of an underlying insulating layer and under a portion of an overlying insulating layer;

a stack of vertically adjacent insulating layers after etching back the plurality of word line layers have vertical sidewalls defining a first vertical plane; and a vertical stack of the word line layer after etching back the plurality of word line layers have vertical sidewalls defining a second vertical plane, wherein the second vertical plane is spaced horizontally from the first vertical plane.

27. The method of claim 22, wherein the connection to the vertical TFT select device is an upper surface of a conductive hard mask overlying an upper node of the vertical TFT select device.

* * * * *

UNITED STATES PATENT AND TRADEMARK OFFICE
CERTIFICATE OF CORRECTION

PATENT NO. : 9,450,023 B1  
APPLICATION NO. : 14/681398  
DATED : September 20, 2016  
INVENTOR(S) : Konevecki et al.

Page 1 of 1

It is certified that error appears in the above-identified patent and that said Letters Patent is hereby corrected as shown below:

Page 2, References Cited, Other Publications, Column 2, Line 50: Delete "Viazzocchi et al." and replace with -- Mazzocchi et al. --

Signed and Sealed this
Eighteenth Day of April, 2017

Michelle K. Lee
*Director of the United States Patent and Trademark Office*